(12) United States Patent
Dai et al.

(10) Patent No.: US 12,520,725 B2
(45) Date of Patent: Jan. 6, 2026

(54) ORGANIC COMPOUND AND APPLICATION THEREOF

(71) Applicants: Wuhan Tianma Microelectronics Co., Ltd., Wuhan (CN); Wuhan Tianma Microelectronics Co., Ltd. Shanghai Branch, Shanghai (CN)

(72) Inventors: Wenpeng Dai, Wuhan (CN); Wei Gao, Wuhan (CN); Lu Zhai, Wuhan (CN)

(73) Assignees: Wuhan Tianma Microelectronics Co., Ltd., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 867 days.

(21) Appl. No.: 17/849,466

(22) Filed: Jun. 24, 2022

(65) Prior Publication Data

US 2022/0336756 A1    Oct. 20, 2022

(30) Foreign Application Priority Data

Feb. 23, 2022    (CN) .......................... 202210166809.6

(51) Int. Cl.

| | | |
|---|---|---|
| H01L 51/00 | (2006.01) | |
| C07D 403/10 | (2006.01) | |
| H10K 85/60 | (2023.01) | |
| H10K 50/11 | (2023.01) | |
| H10K 50/15 | (2023.01) | |
| H10K 101/10 | (2023.01) | |

(52) U.S. Cl.
CPC ....... H10K 85/6572 (2023.02); C07D 403/10 (2013.01); H10K 85/654 (2023.02); H10K 50/11 (2023.02); H10K 50/15 (2023.02); H10K 2101/10 (2023.02)

(58) Field of Classification Search
None
See application file for complete search history.

(56) References Cited

FOREIGN PATENT DOCUMENTS

| | | |
|---|---|---|
| CN | 104178104 A | 12/2014 |
| CN | 111704605 A | 9/2020 |
| KR | 20150106668 A | 9/2015 |
| KR | 20150124637 A | 11/2015 |
| TW | 201237137 A | 9/2012 |

OTHER PUBLICATIONS

Machine English translation of Chen et al. (CN 111704605 A). Jul. 14, 2025.*

* cited by examiner

*Primary Examiner* — Jay Yang
(74) *Attorney, Agent, or Firm* — KDW Firm PLLC

(57) ABSTRACT

Provided are an organic compound and an application thereof. The organic compound has good thermal stability and film formability and an appropriate glass transition temperature Tg, which is conducive to forming a stable and uniform thin film during thermal vacuum evaporation and reducing phase separation, maintaining the stability of a device. When used as a host material of a light-emitting layer and/or a material of a hole transport layer of an organic electroluminescent device, the organic compound has balanced hole and electron transport performance and can obtain a relatively wide carrier recombination region, improving the luminescence efficiency of the device.

17 Claims, 1 Drawing Sheet

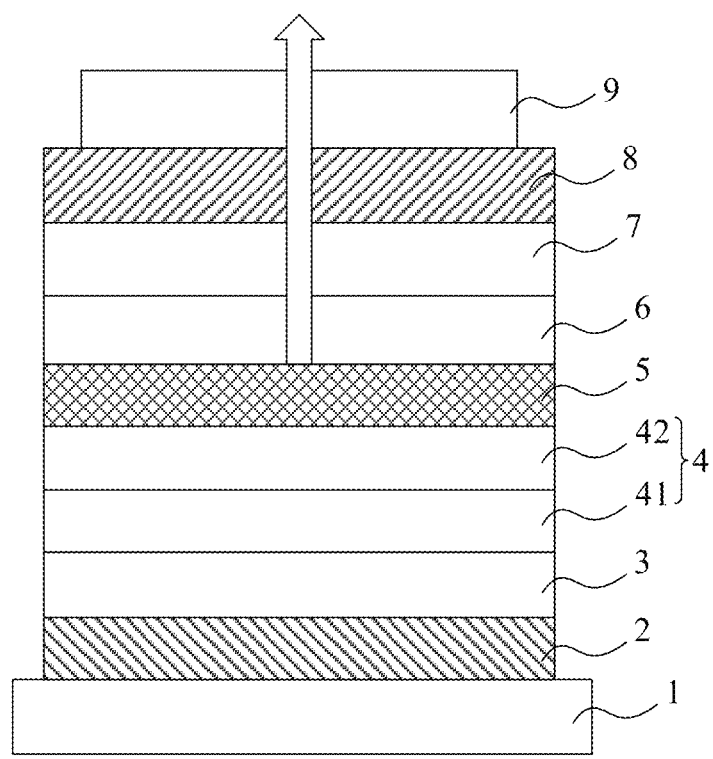

ORGANIC COMPOUND AND APPLICATION THEREOF

CROSS-REFERENCE TO RELATED APPLICATION(S)

This application claims priority to Chinese Patent Application No. CN 202210166809.6 filed Feb. 23, 2022, the disclosure of which is incorporated herein by reference in its entirety.

TECHNICAL FIELD

The present disclosure belongs to the field of organic electroluminescent materials and relates to an organic compound and an application thereof.

BACKGROUND

Organic electroluminescent materials can be divided into electrofluorescence and electrophosphorescence according to a luminescence mechanism, where fluorescence is the radiative decay and transition of singlet excitons while phosphorescence is light emitted during the radiative decay of triplet excitons to a ground state. According to the theory of spin quantum statistics, singlet excitons and triplet excitons are formed at a ratio of 1:3. A fluorescent material has an internal quantum efficiency lower than or equal to 25% and an external quantum efficiency which is generally lower than 5%. An electrophosphorescent material has an internal quantum efficiency of 100% in theory and an external quantum efficiency which can reach 20%.

A phosphorescent heavy metal material has a relatively long lifetime and may cause triplet-triplet annihilation and concentration quenching at a high current density, resulting in the degradation of device performance. Therefore, the phosphorescent heavy metal material is generally doped into a suitable host material to form a host-guest doping system, so as to optimize energy transfer and maximize luminescence efficiency and a lifetime. In the current research, the commercialization of heavy metal doping materials is mature and it is difficult to develop alternative doping materials. Therefore, it is a common idea among researchers to focus on the development of phosphorescent host materials.

An existing phosphorescent host material causes unbalanced carriers in a light-emitting layer, resulting in severe efficiency roll-off. This is mainly because the HOMO energy level and the LUMO energy level of the host material do not match the energy levels of a material in an adjacent layer and there are obvious differences in carrier transport. Therefore, it is expected in the art to develop a new phosphorescent host material to improve the luminescence efficiency of a device.

SUMMARY

The present disclosure provides an organic compound and an application thereof.

A first aspect of the present disclosure is to provide an organic compound, where the organic compound has a structure represented by Formula I:

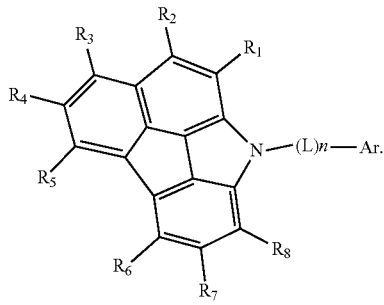

Formula I

In Formula I, $R_1$ to $R_8$ are each independently selected from H, substituted or unsubstituted C1 to C10 alkyl, substituted or unsubstituted C1 to C10 cycloalkyl, substituted or unsubstituted C6 to C30 aryl, substituted or unsubstituted C3 to C30 heteroaryl, $-OR^9$ or $-SR^9$;

$R^9$ is selected from H, substituted or unsubstituted C1 to C10 alkyl, substituted or unsubstituted C1 to C10 cycloalkyl, substituted or unsubstituted C6 to C30 aryl, or substituted or unsubstituted C3 to C30 heteroaryl;

L is selected from a linkage bond, substituted or unsubstituted C6 to C30 aryl or substituted or unsubstituted C3 to C30 heteroaryl;

n is an integer from 0 to 3 (for example, 0, 1, 2 or 3), and Ar is selected from substituted or unsubstituted C6 to C30 aryl, or substituted or unsubstituted C3 to C30 heteroaryl.

In the present disclosure, C1 to C10 may each independently be C1, C2, C3, C4, C5, C6, C7, C8, C9 or C10.

C6 to C30 may each independently be C6, C9, C10, C12, C13, C14, C15, C16, C18, C20, C22, C24, C26, C28, C29, etc.

C3 to C30 may each independently be C4, C6, C9, C10, C12, C13, C14, C15, C16, C18, C20, C22, C24, C26, C28, C29, etc.

The organic compound provided by the present disclosure has good thermal stability and film formability and an appropriate glass transition temperature Tg, which is conducive to forming a stable and uniform thin film during thermal vacuum evaporation and reducing phase separation, maintaining the stability of a device. When used as a host material of a light-emitting layer of an organic electroluminescent device, the organic compound has balanced hole and electron transport performance and can obtain a relatively wide carrier recombination region, improving the luminescence efficiency of the device.

A second aspect of the present disclosure is to provide an organic electroluminescent material including the organic compound as described in the first aspect.

A third aspect of the present disclosure is to provide an OLED device including an anode, a cathode and an organic thin film layer disposed between the anode and the cathode, wherein a material of the organic thin film layer includes the organic electroluminescent material as described in the second aspect.

A fourth aspect of the present disclosure is to provide a display panel including the OLED device as described in the third aspect.

Compared with the related art, the present disclosure has the beneficial effects described below.

The organic compound provided by the present disclosure has good thermal stability and film formability and an appropriate glass transition temperature Tg, which is conducive to forming the stable and uniform thin film during the thermal vacuum evaporation and reducing the phase separation, maintaining the stability of the device. When used as the host material of the light-emitting layer of the organic electroluminescent device, the organic compound has the balanced hole and electron transport performance and can obtain a relatively wide carrier recombination region, improving the luminescence efficiency of the device. When used as a host material for red light or simultaneously used as the host material of the light-emitting layer and a material of a hole transport layer, the compound of the present disclosure causes the OLED device to have a lower driving voltage, higher luminescence efficiency and a longer service life.

BRIEF DESCRIPTION OF DRAWINGS

The FIG. 1 is a structure diagram of an OLED device according to the present disclosure, where the direction of an arrow represents a light emission direction.

REFERENCE LIST 1 substrate
2 anode
3 hole injection layer
4 hole transport layer
41 first hole transport layer
42 second hole transport layer
5 light-emitting layer
6 electron transport layer
7 electron injection layer
8 cathode
9 capping layer

DETAILED DESCRIPTION

Technical solutions of the present disclosure are further described below through embodiments. It is to be understood by those skilled in the art that the embodiments described herein are used for a better understanding of the present disclosure and are not to be construed as specific limitations to the present disclosure.

A first aspect of the present disclosure is to provide an organic compound, where the organic compound has a structure represented by Formula I:

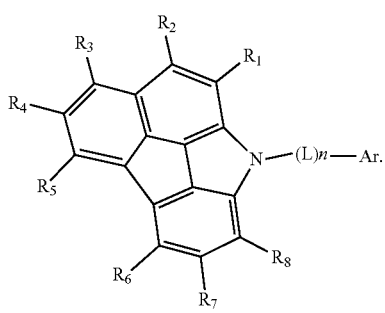

Formula I

In the Formula I, $R_1$ to $R_8$ are each independently selected from H, substituted or unsubstituted C1 to C10 alkyl, substituted or unsubstituted C1 to C10 cycloalkyl, substituted or unsubstituted C6 to C30 aryl, substituted or unsubstituted C3 to C30 heteroaryl, $-OR^9$ or $-SR^9$;

$R^9$ is selected from H, substituted or unsubstituted C1 to C10 alkyl, substituted or unsubstituted C1 to C10 cycloalkyl, substituted or unsubstituted C6 to C30 aryl, or substituted or unsubstituted C3 to C30 heteroaryl;

L is selected from a linkage bond, substituted or unsubstituted C6 to C30 aryl, or substituted or unsubstituted C3 to C30 heteroaryl;

n is an integer from 0 to 3 (for example, 0, 1, 2 or 3), and Ar is selected from substituted or unsubstituted C6 to C30 aryl, or substituted or unsubstituted C3 to C30 heteroaryl.

In the present disclosure, C1 to C10 may each independently be C1, C2, C3, C4, C5, C6, C7, C8, C9 or C10.

C6 to C30 may each independently be C6, C9, C10, C12, C13, C14, C15, C16, C18, C20, C22, C24, C26, C28, C29, etc.

C3 to C30 may each independently be C4, C6, C9, C10, C12, C13, C14, C15, C16, C18, C20, C22, C24, C26, C28, C29, etc.

The organic compound provided by the present disclosure has good thermal stability and film formability and an appropriate glass transition temperature Tg, which is conducive to forming a stable and uniform thin film during thermal vacuum evaporation and reducing phase separation, maintaining the stability of a device. When used as a host material of a light-emitting layer of an organic electroluminescent device, the organic compound has balanced hole and electron transport performance and can obtain a relatively wide carrier recombination region, improving the luminescence efficiency of the device.

In one embodiment, a substituent in the substituted C1 to C10 alkyl, substituted C1 to C10 cycloalkyl, substituted C1 to C10 alkoxy, substituted C6 to C30 aryl, substituted C6 to C30 aryloxy, or substituted C3 to C30 heteroaryl is selected from deuterium, fluorine, trifluoromethyl, cyano, methyl, ethyl, t-butyl, isopropyl or methoxy.

In one embodiment, the organic compound has a structure represented by Formula II:

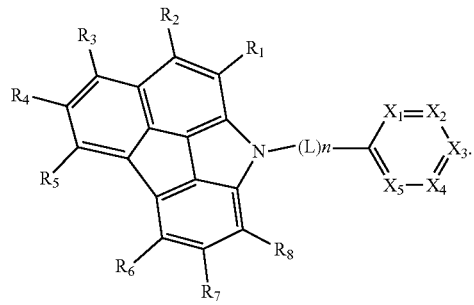

Formula II

In the Formula II, $X_1$ to $X_5$ are each independently selected from N or $CR_A$, and each $R_A$ is independently selected from H, substituted or unsubstituted C1 to C10 alkyl, substituted or unsubstituted C1 to C10 cycloalkyl, substituted or unsubstituted C6 to C30 aryl. or substituted or unsubstituted C3 to C30 heteroaryl; and $R_1$ to $R_8$, L and n are defined the same as those in Formula I.

In one embodiment, the organic compound has a structure represented by Formula III:

Formula III

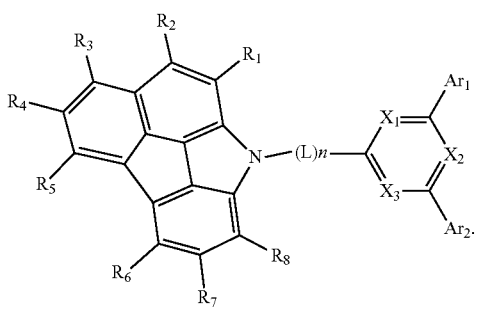

In the Formula III, $X_1$ to $X_3$ are each independently selected from N or $CR_A$, and each $R_A$ is independently selected from H, substituted or unsubstituted C1 to C10 alkyl, substituted or unsubstituted C1 to C10 cycloalkyl, substituted or unsubstituted C6 to C30 aryl, or substituted or unsubstituted C3 to C30 heteroaryl; and $Ar_1$ and $Ar_2$ are independently selected from substituted or unsubstituted C6 to C30 aryl, or substituted or unsubstituted C3 to C30 heteroaryl; and $R_1$ to $R_8$, L and n are defined the same as those in Formula I.

In one embodiment, the organic compound has a structure represented by Formula IV:

Formula IV

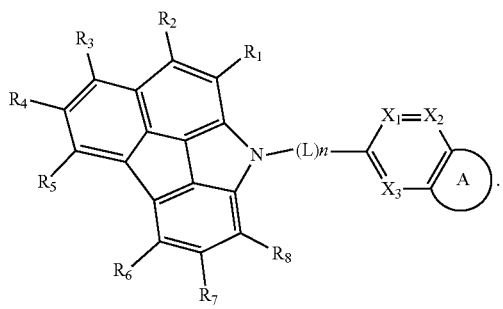

In the Formula IV, $X_1$ to $X_3$ are each independently selected from N or $CR_A$, and each $R_A$ is independently selected from H, substituted or unsubstituted C1 to C10 alkyl, substituted or unsubstituted C1 to C10 cycloalkyl, substituted or unsubstituted C6 to C30 aryl, or substituted or unsubstituted C3 to C30 heteroaryl; and $Ar_1$, $Ar_2$ and A are independently selected from substituted or unsubstituted C6 to C30 aryl, or substituted or unsubstituted C3 to C30 heteroaryl; and $R_1$ to $R_8$, L and n are defined the same as those in Formula I.

In Formula IV, the ring A represents that the ring A is fused to a ring where the ring A is located.

In one embodiment, $R_1$ to $R_8$ are each independently selected from H, deuterium, fluorine, trifluoromethyl, cyano, methyl, ethyl, t-butyl, isopropyl, cyclopropyl, cyclopentyl, methoxy, phenyl, cyano-substituted phenyl, pyridyl or phenoxy.

In one embodiment, L is selected from a single bond, substituted or unsubstituted phenylene, substituted or unsubstituted biphenylene, substituted or unsubstituted naphthylene, substituted or unsubstituted phenylene-naphthylene, substituted or unsubstituted phenanthrylene, substituted or unsubstituted pyridylene, or substituted or unsubstituted pyridylene-pyridylene.

In one embodiment, Ar is selected from substituted or unsubstituted phenyl, substituted or unsubstituted phenanthryl, substituted or unsubstituted pyridyl, substituted or unsubstituted triazinyl, substituted or unsubstituted benzopyrimidinyl, or substituted or unsubstituted arylamine; and a substituent in the substituted group is selected from C6 to C30 (which may be, for example, C6, C9, C10, C12, C13, C14, C15, C16, C18, C20, C22, C24, C26, C28, C29, etc.) aryl.

In one embodiment, Ar is selected from

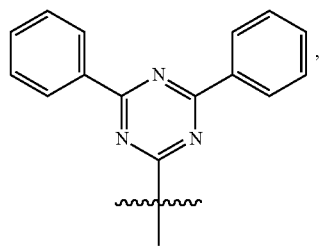

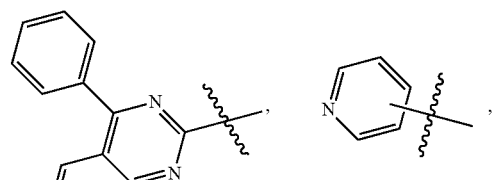

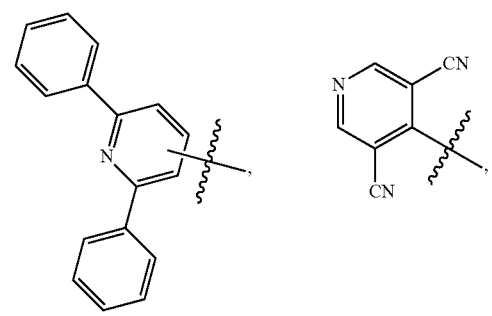

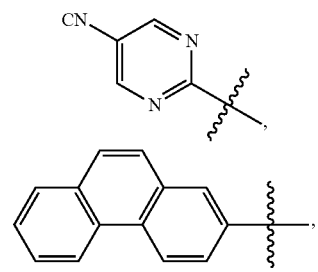

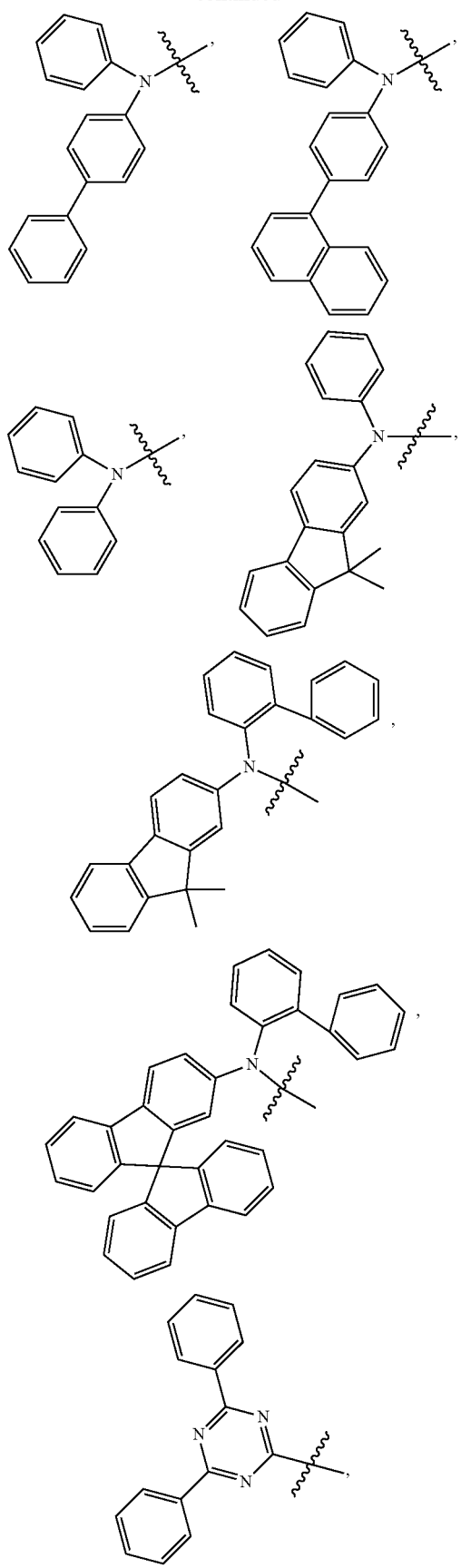
In one embodiment, $R_A$ is selected from H, phenyl, biphenyl or pyridyl.
In one embodiment, the ring A is selected from a benzene ring or a naphthalene ring.
The ring A is drawn as
indicating that the ring A is fused to the ring to which the ring A is linked, so as to form a ring structure.
In one embodiment, the organic compound is any one of the following compounds:

P1
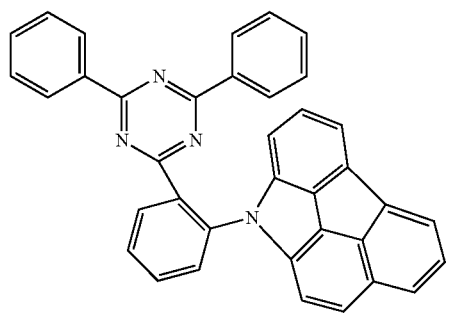
P2
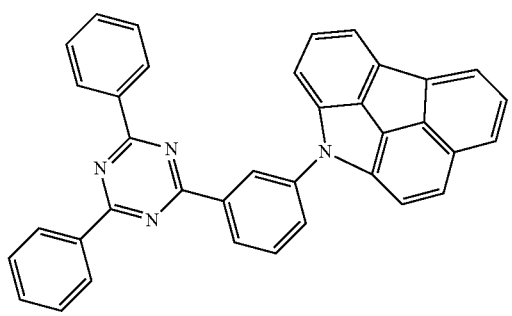
P3
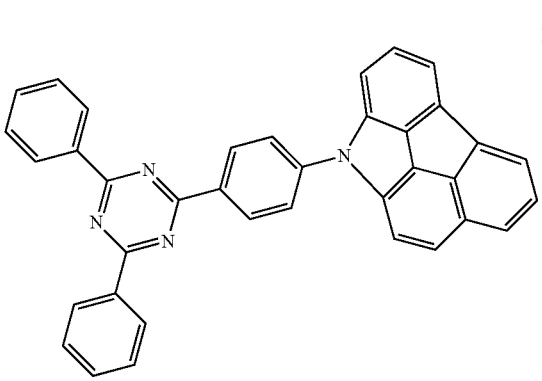
P9
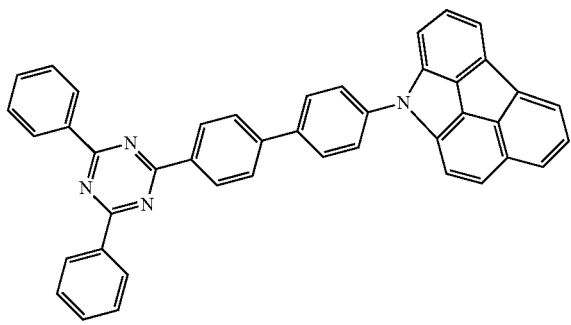
P10
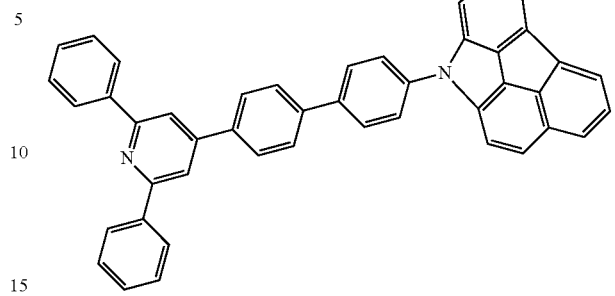
P11
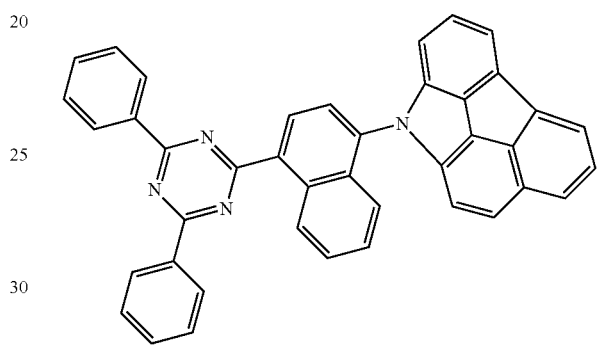
P12
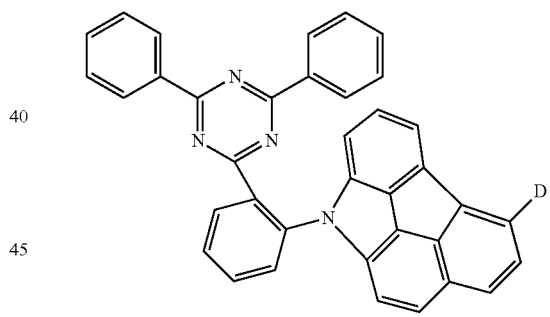
P13
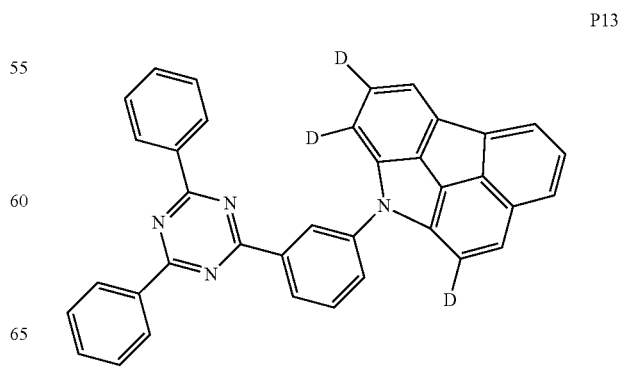

P14
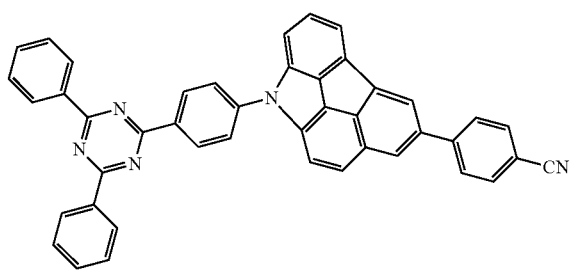
P15
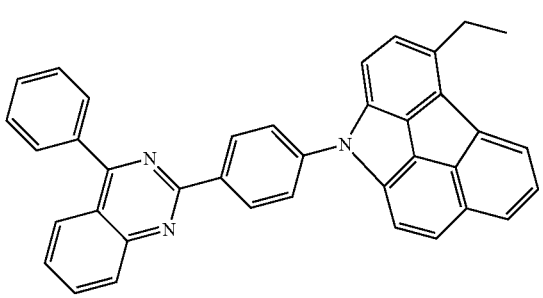
P16
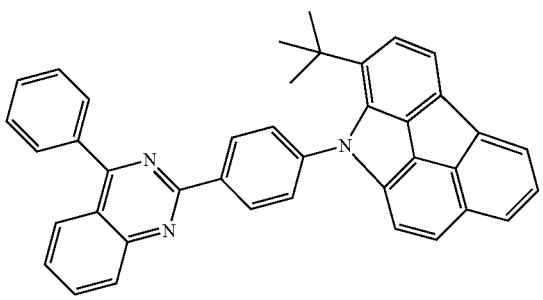
P17
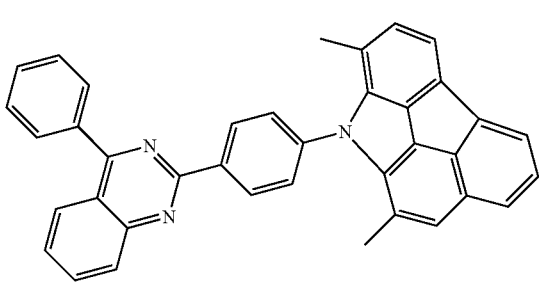
P18
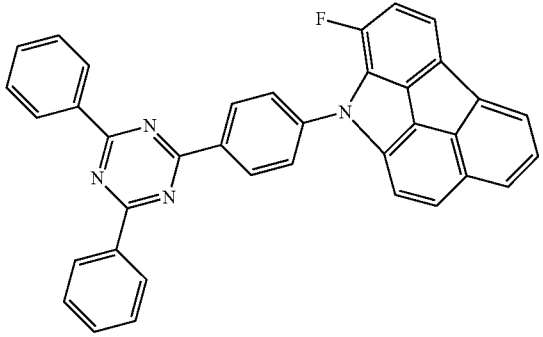
P19
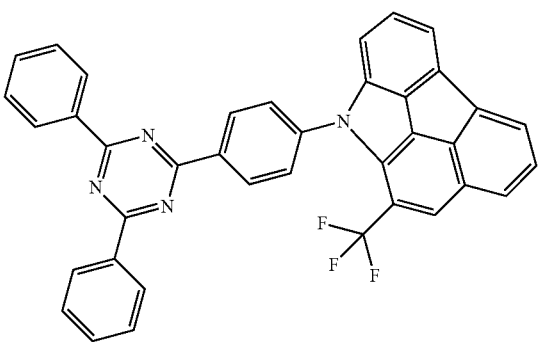
P20
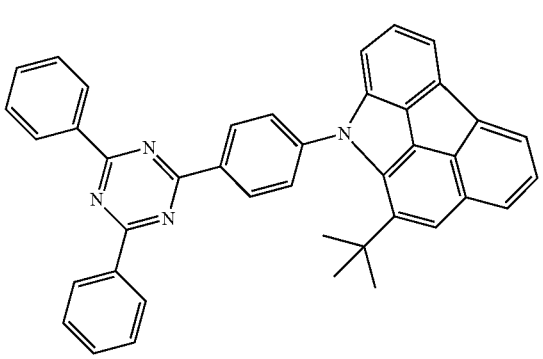
P21
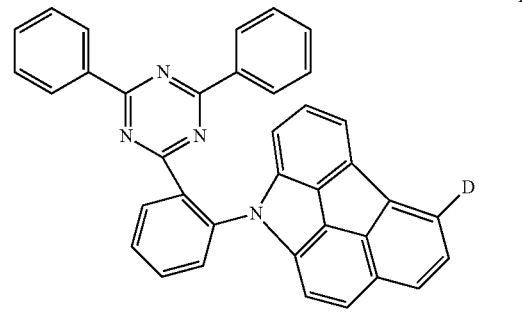
P23
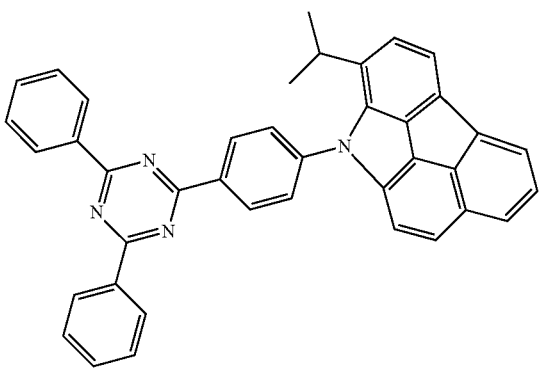

P24
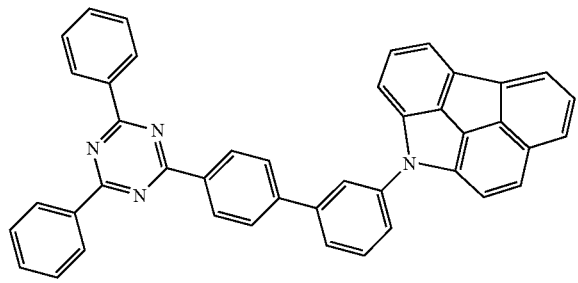
P25
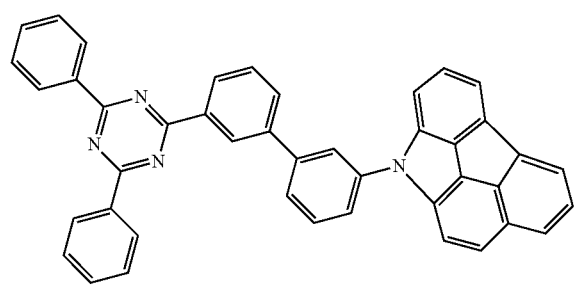
P26
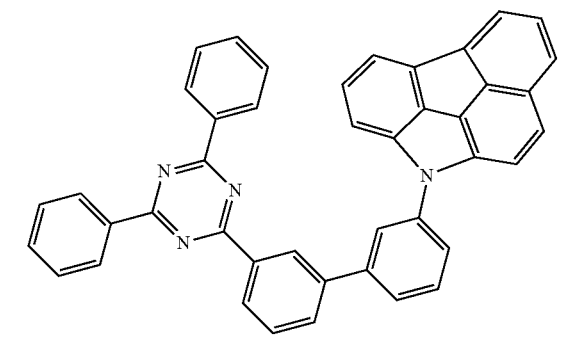
P27
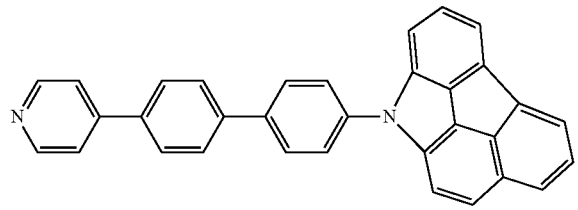
P28
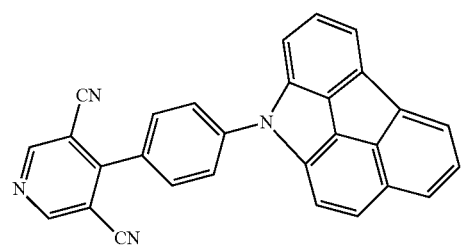
P29
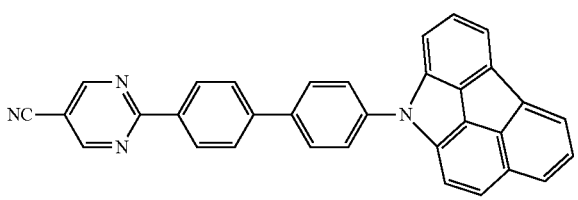
P33
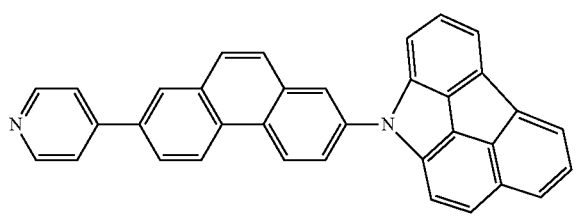
P34
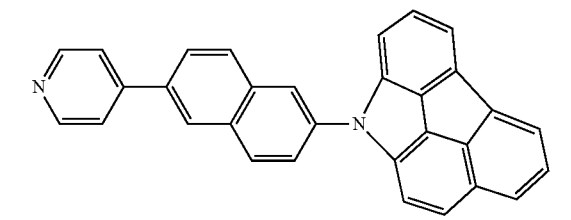
P35
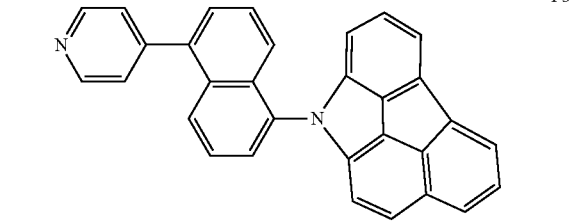
P36
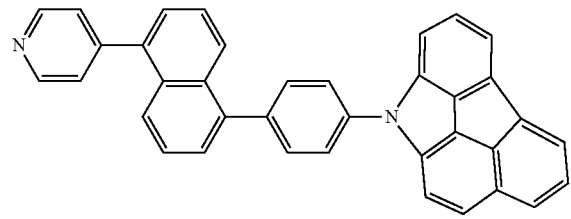
P37
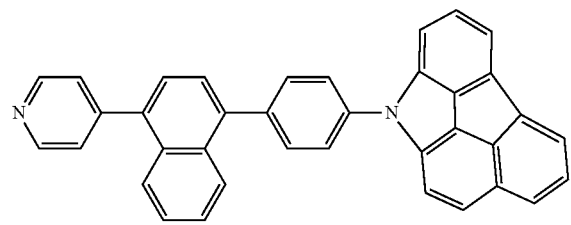

P38
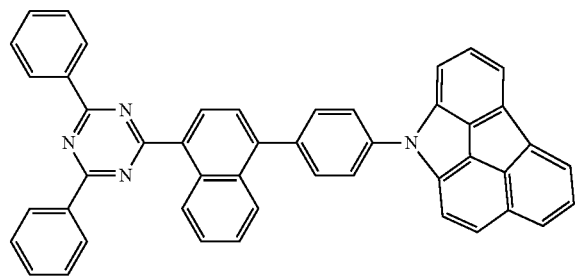
P39
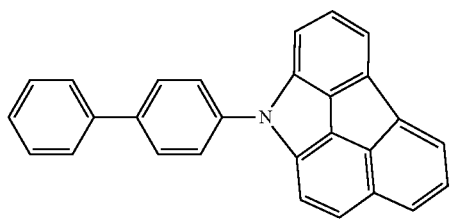
P48
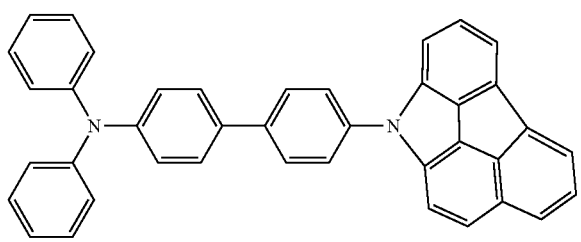
P49
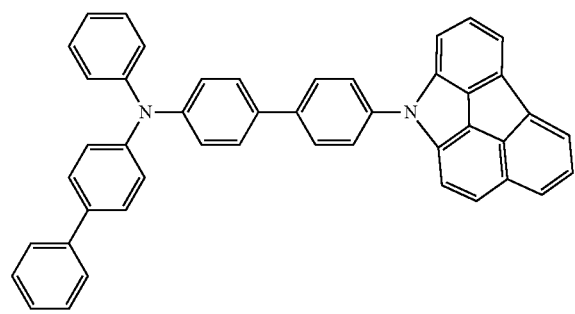
P50
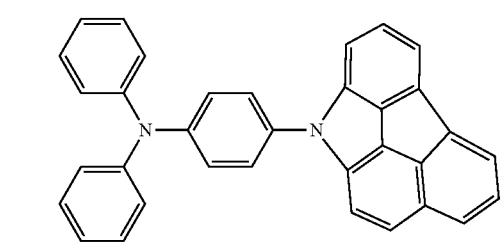
P58
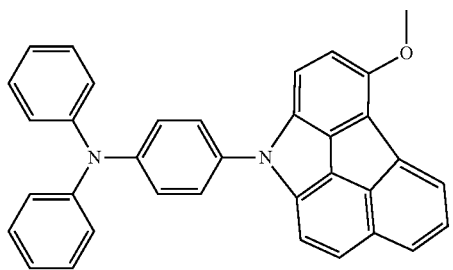
P59
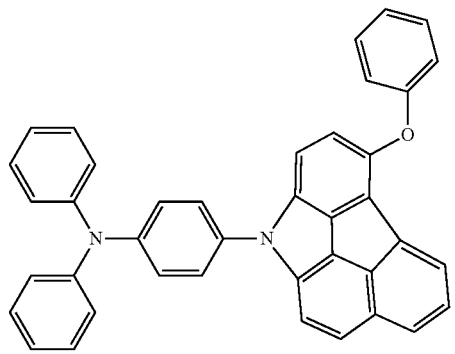
P60
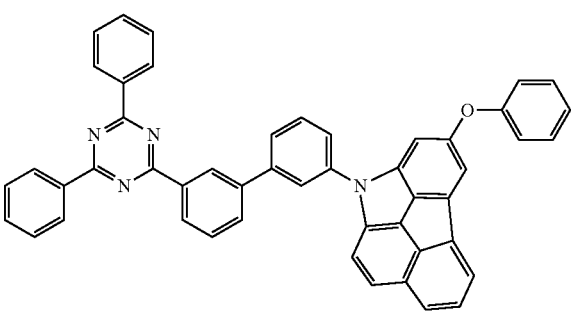
P61
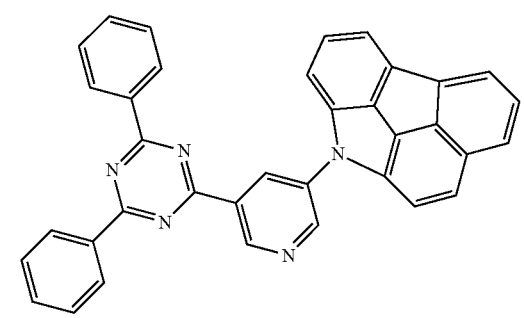
P62
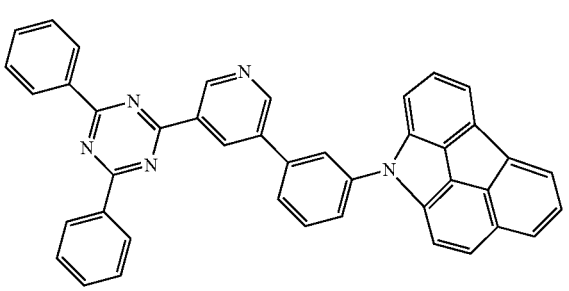
P63
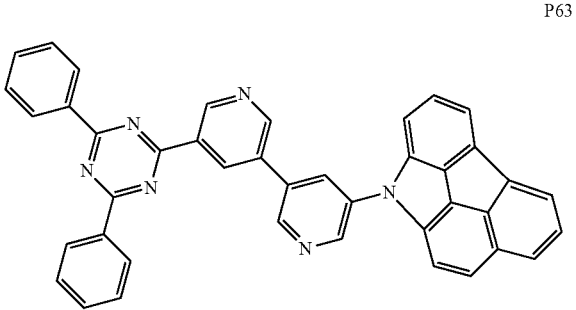

P65
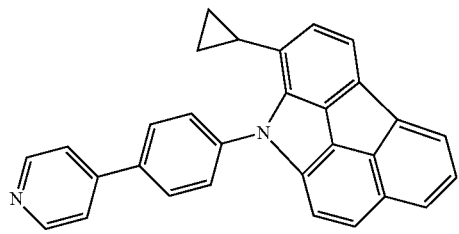
P66
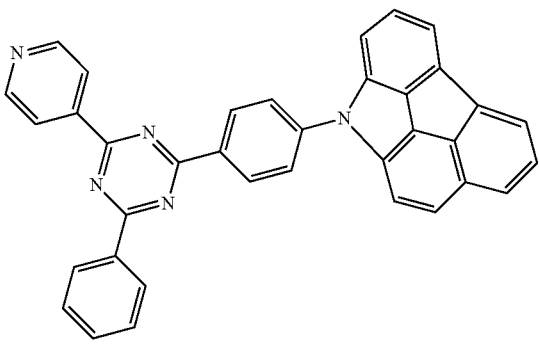
P67
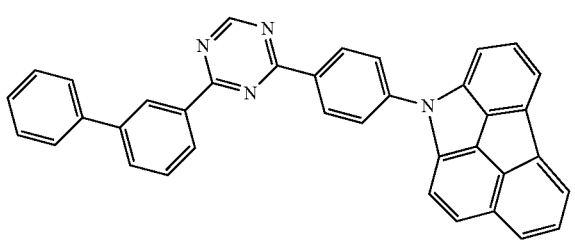
P68
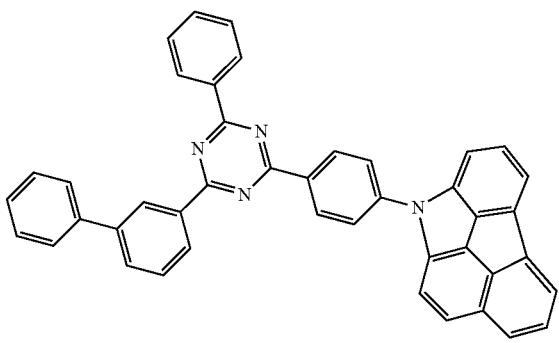
wherein, D represents deuterium.
In one embodiment, the organic compound is any one of the following compounds:
P4
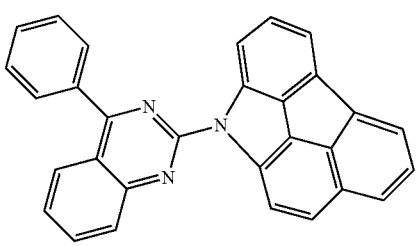
P5
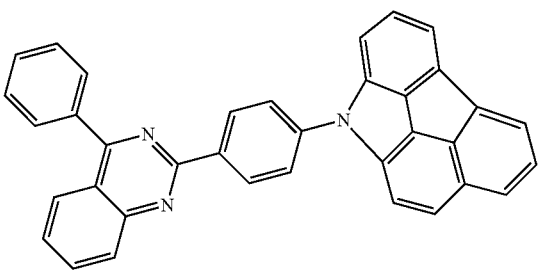
P6
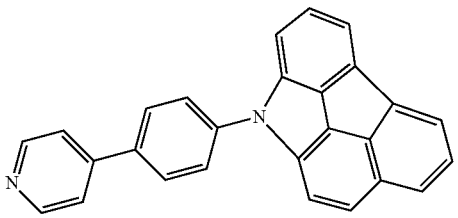
P5
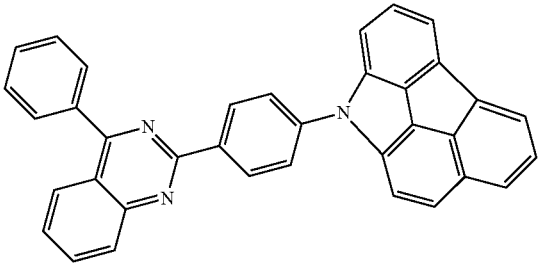
P6
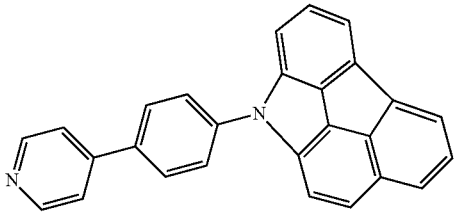
P7
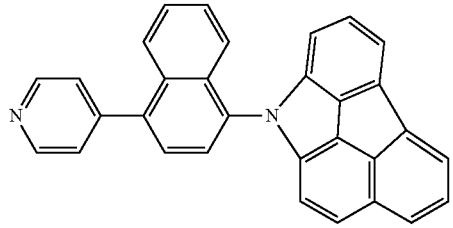
P8
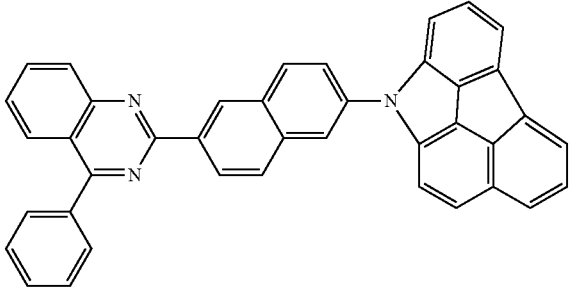

P15
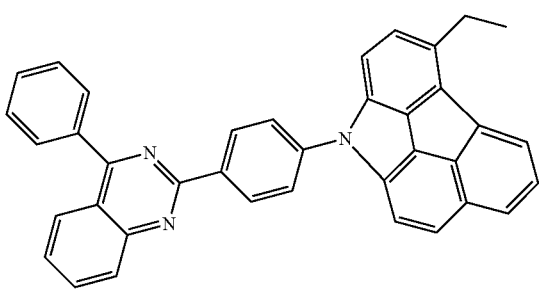
P16
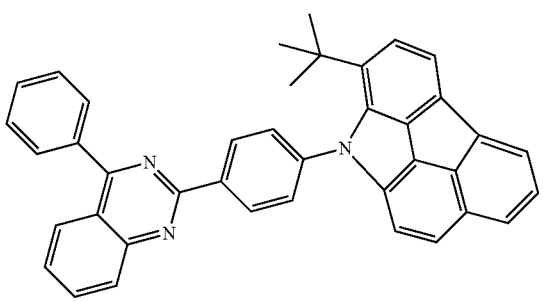
P17
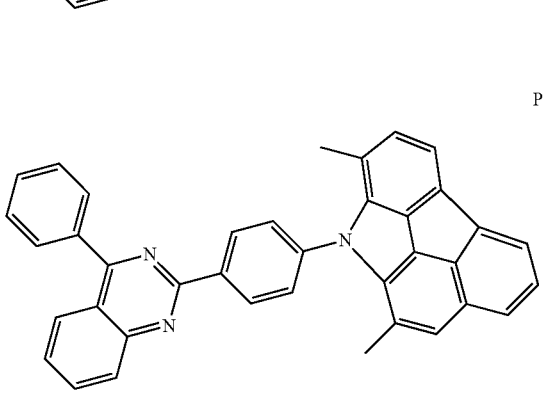
P22
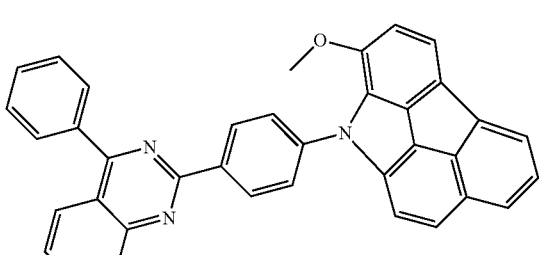
P30
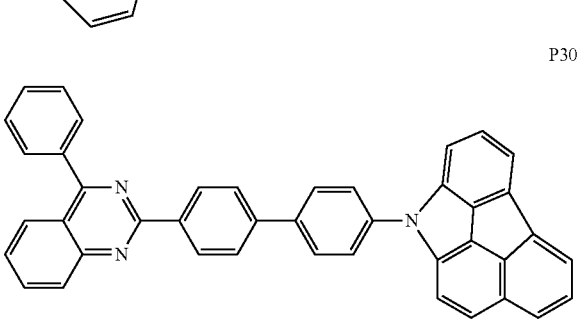
P31
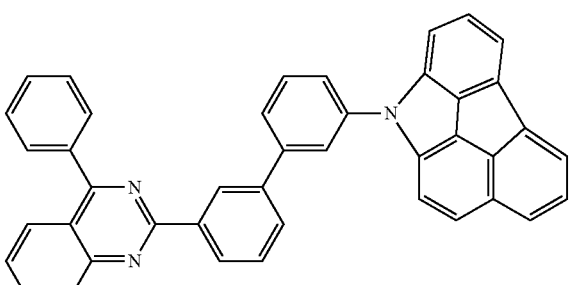
P32
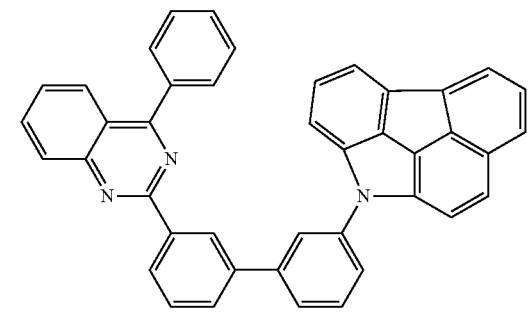
P40
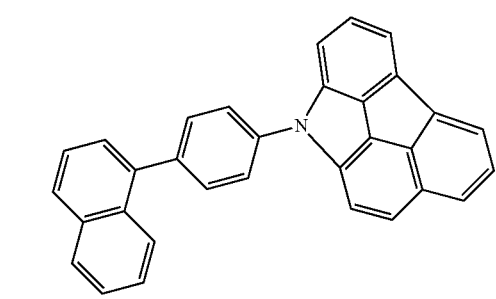
P41
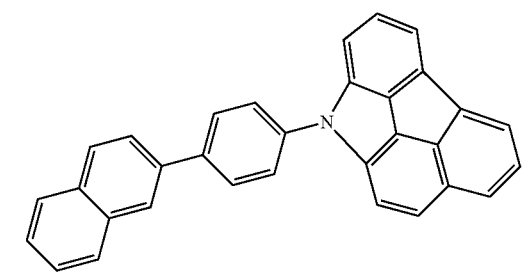
P42
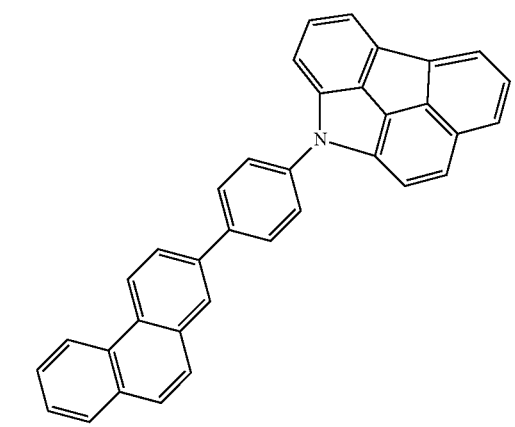

P43
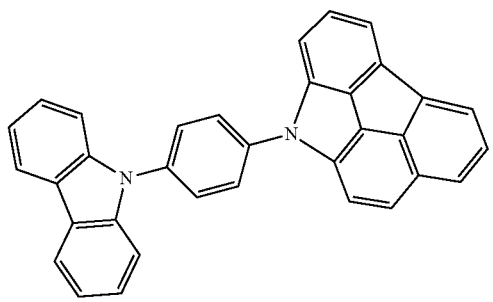
P44
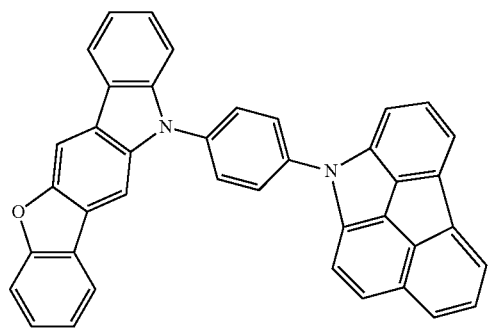
P45
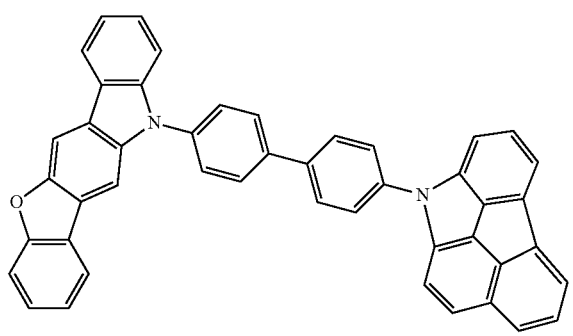
P46
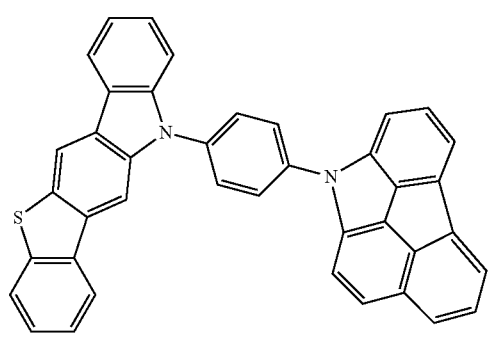
P47
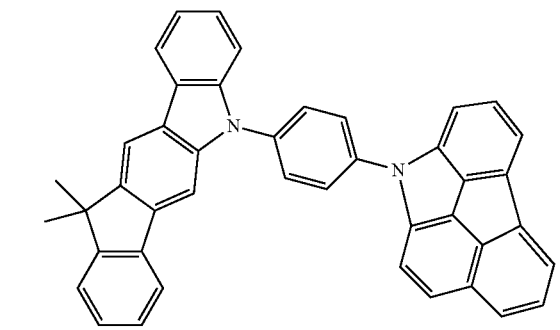
P51
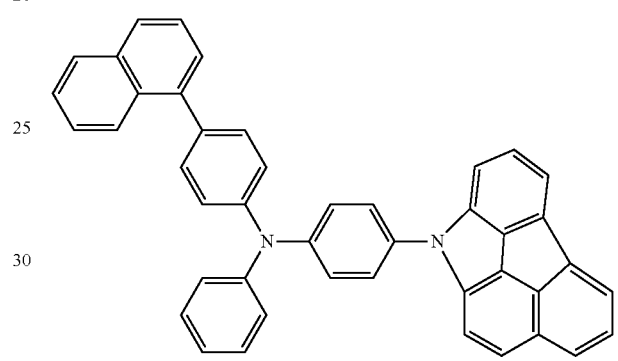
P52
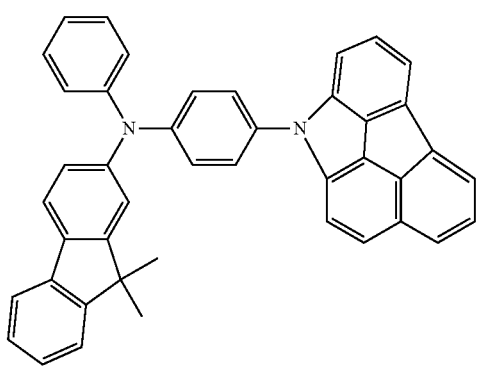
P53
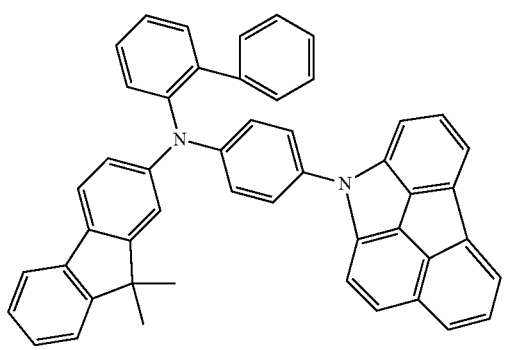

P54

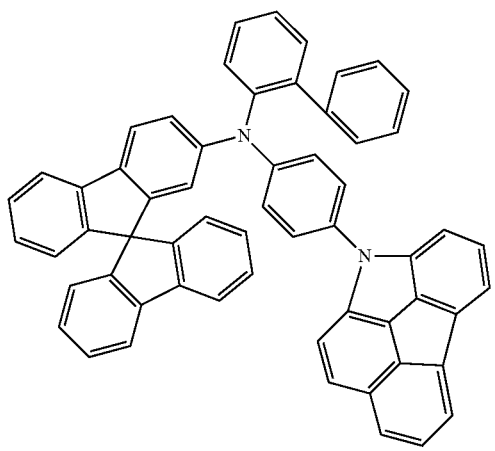

P55

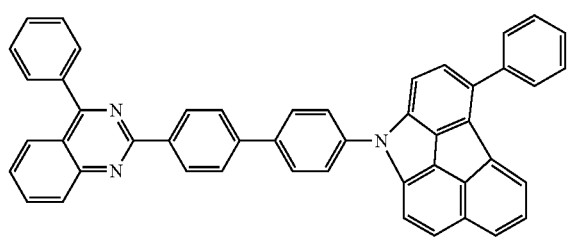

P56

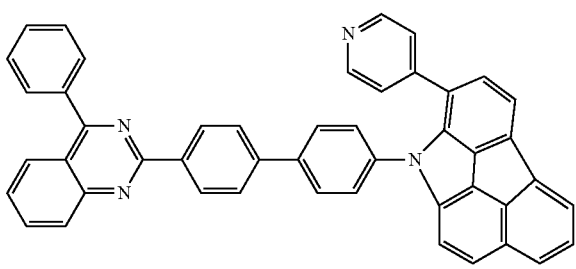

P57

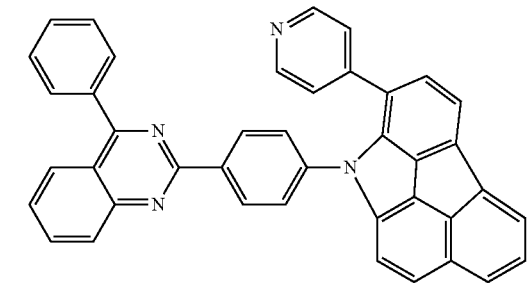

P64 or

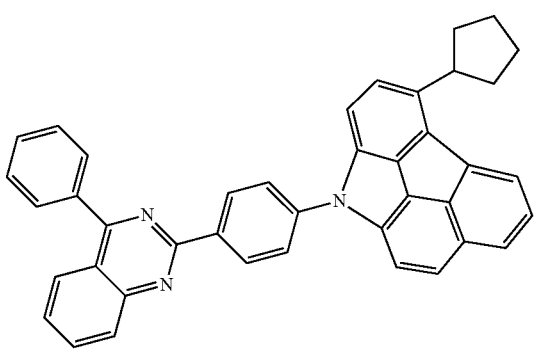

P69

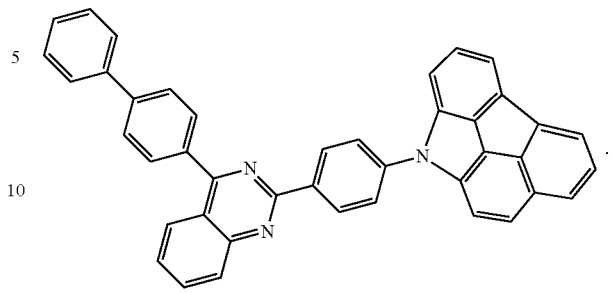

A second aspect of the present disclosure is to provide an organic electroluminescent material including the organic compound as described in the first aspect.

A third aspect of the present disclosure is to provide an OLED device including an anode, a cathode and an organic thin film layer disposed between the anode and the cathode, where a material of the organic thin film layer includes the organic electroluminescent material as described in the second aspect.

In one embodiment, the organic thin film layer includes a light-emitting layer which includes the organic compound as described in the first aspect as a host material.

In one embodiment, the organic thin film layer includes the light-emitting layer and a hole transport layer, where the light-emitting layer includes the organic compound as described in the first aspect as the host material, and a material of the hole transport layer includes the organic compound as described in the first aspect.

In the OLED device provided by the present disclosure, a material of the anode may be a metal, a metal oxide or a conductive polymer, where the metal includes copper, gold, silver, iron, chromium, nickel, manganese, palladium, platinum, etc. as well as alloys thereof, the metal oxide includes indium tin oxide (ITO), indium zinc oxide (IZO), zinc oxide, indium gallium zinc oxide (IGZO), etc., and the conductive polymer includes polyaniline, polypyrrole, poly(3-methylthiophene), etc. In addition to the above materials that facilitate hole injection and combinations thereof, the material of the anode further includes known materials suitable for use as the anode.

In the OLED device, a material of the cathode may be a metal or a multilayer metal material, wherein the metal includes aluminum, magnesium, silver, indium, tin, titanium, etc. as well as alloys thereof, and the multilayer metal material includes LiF/Al, $LiO_2$/Al, $BaF_2$/Al, etc. In addition to the above materials that facilitate electron injection and combinations thereof, the material of the cathode further includes known materials suitable for use as the cathode.

In the OLED device, the organic thin film layer includes at least one light-emitting layer (EML) and any one or a combination of at least two of a hole injection layer (HIL), a hole transport layer (HTL), an electron blocking layer (EBL), a hole blocking layer (HBL), an electron transport layer (ETL) or an electron injection layer (EIL) that are arranged on two sides of the at least one light-emitting layer.

The OLED device may be prepared by the following method: forming the anode on a transparent or opaque smooth substrate, forming the organic thin film layer on the anode, and forming the cathode on the organic thin film layer. The organic thin film layer may be formed by using known film forming methods such as evaporation, sputtering, spin coating, impregnation and ion plating.

A fourth aspect of the present disclosure is to provide a display panel including the OLED device as described in the third aspect.

A method for preparing the organic compound of the present disclosure is exemplarily described below:

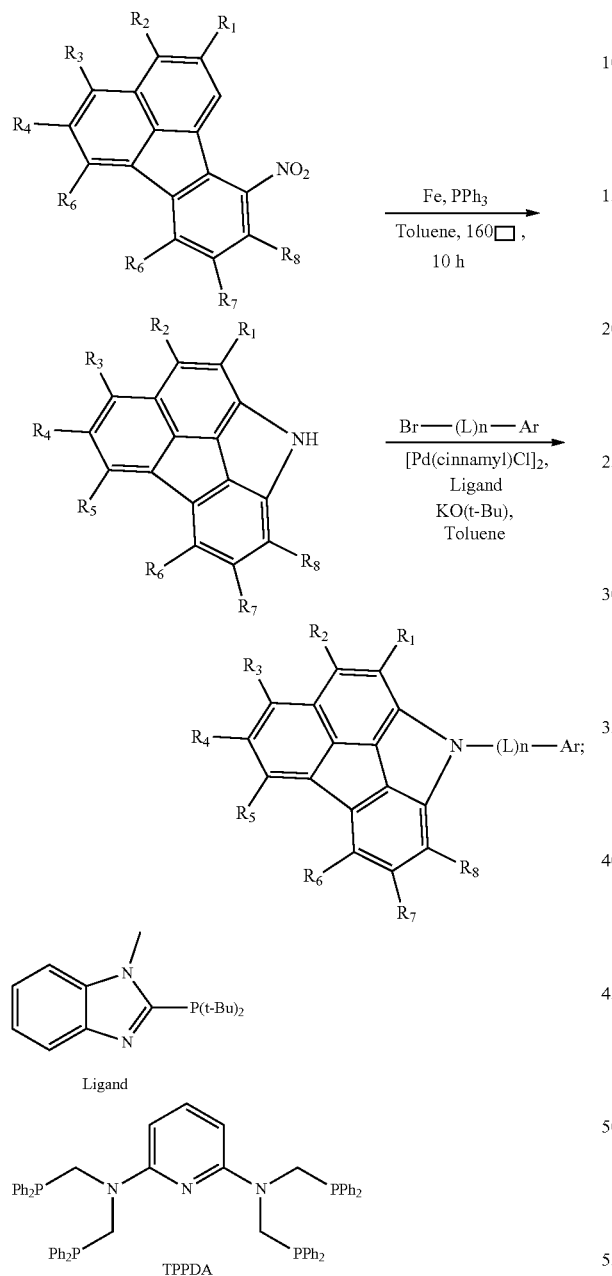

wherein, Toluene represents toluene, KO(t-Bu) represents potassium tert-butoxide, and [Pd(cinnamyl)Cl]$_2$ represents palladium(1-phenylallyl)chloride.

The specific synthesis methods for a series of compounds are exemplarily provided in the following examples. Compounds whose specific synthesis methods are not mentioned may be synthesized by similar methods or other existing methods, which are not specifically limited in the present disclosure.

Preparation Example 1

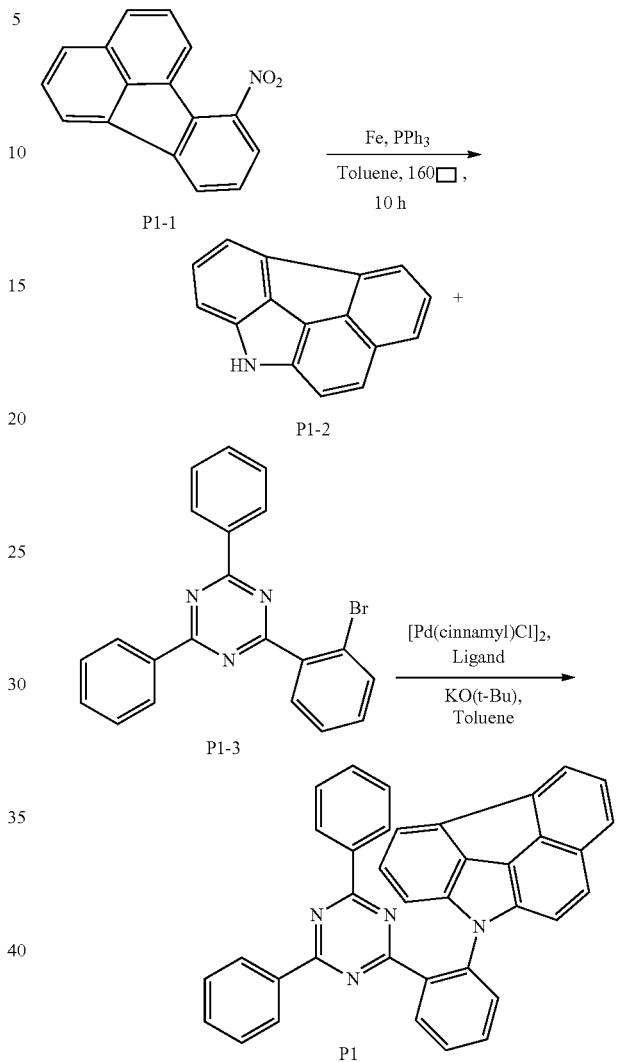

(1) P1-1 (0.5 mmol), iron powder (0.5 mmol) and PPh$_3$ (0.5 mmol) were added to 3 mL of toluene and mixed into a solution, and the solution was put into a 50 mL flask and reacted at 106° C. for 10 h. The solution was cooled to room temperature and slowly added with a saturated aqueous solution of MgSO$_4$ and ethyl acetate to be extracted three times. Then, the organic layer passed through a rotary evaporator to remove the solvent and was subjected to column chromatography to obtain the crude product P1-2.

The structure of the target product P1-2 was tested through matrix-assisted laser desorption/ionization time-of-flight mass spectrometry (MALDI-TOF MS) (m/z) to obtain C$_{16}$H$_9$N whose calculated value was 215.1 and measured value was 215.0.

(2) P1-2 (0.5 mmol), P1-3 (0.75 mmol), KO(t-Bu) (0.75 mmol), [Pd(cinnamyl)Cl]$_2$ (0.02 mol) and Ligand (0.015 mol) were added to 3 mL of toluene and mixed into a solution, and the solution was put into a 50 mL flask and reacted at 80° C. for 12 h. The solution was cooled to room temperature and slowly added with a saturated aqueous solution of MgSO$_4$ and ethyl acetate to be extracted three times. Then, the organic layer passed through a rotary evaporator to remove the solvent and was subjected to column chromatography to obtain the crude product P1.

The structure of the target product P1 was tested through matrix-assisted laser desorption/ionization time-of-flight mass spectrometry (MALDI-TOF MS) (m/z) to obtain $C_{37}H_{22}N_4$ whose calculated value was 522.2 and measured value was 522.1.

Elemental analysis: calculated value: C, 85.04, H, 4.24, N, 10.72; measured value: C, 85.04, H, 4.25, N, 10.72.

Preparation Example 2

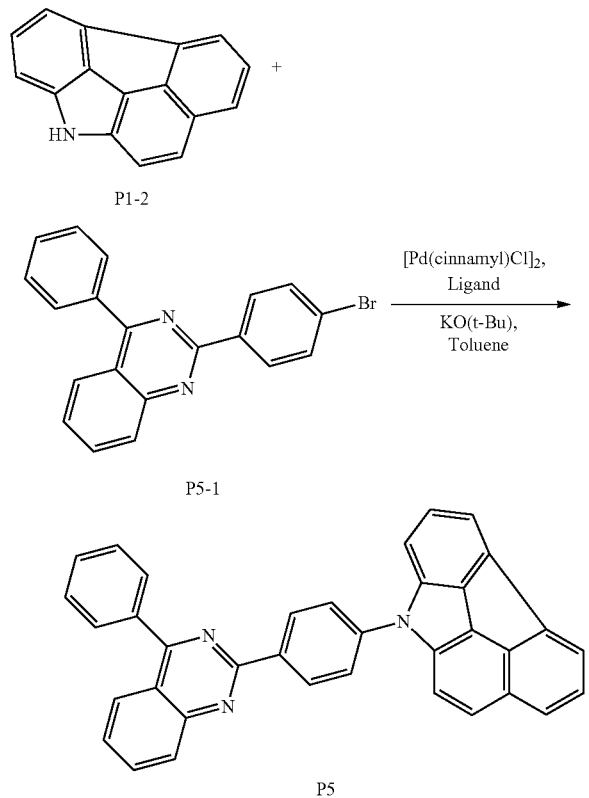

(1) P1-2 (0.5 mmol), P5-1 (0.75 mmol), KO(t-Bu) (0.75 mmol), [Pd(cinnamyl)Cl]$_2$ (0.02 mol) and Ligand (0.015 mol) were added to 3 mL of toluene and mixed into a solution, and the solution was put into a 50 mL flask and reacted at 80° C. for 12 h. The solution was cooled to room temperature and slowly added with a saturated aqueous solution of MgSO$_4$ and ethyl acetate to be extracted three times. Then, the organic layer passed through a rotary evaporator to remove the solvent and was subjected to column chromatography to obtain the crude product P5.

The structure of the target product P5 was tested through matrix-assisted laser desorption/ionization time-of-flight mass spectrometry (MALDI-TOF MS) (m/z) to obtain $C_{36}H_{21}N_3$ whose calculated value was 495.2 and measured value was 495.1.

Elemental analysis: calculated value: C, 87.25, H, 4.27, N, 8.48; measured value: C, 87.25, H, 4.28, N, 8.49.

Preparation Example 3

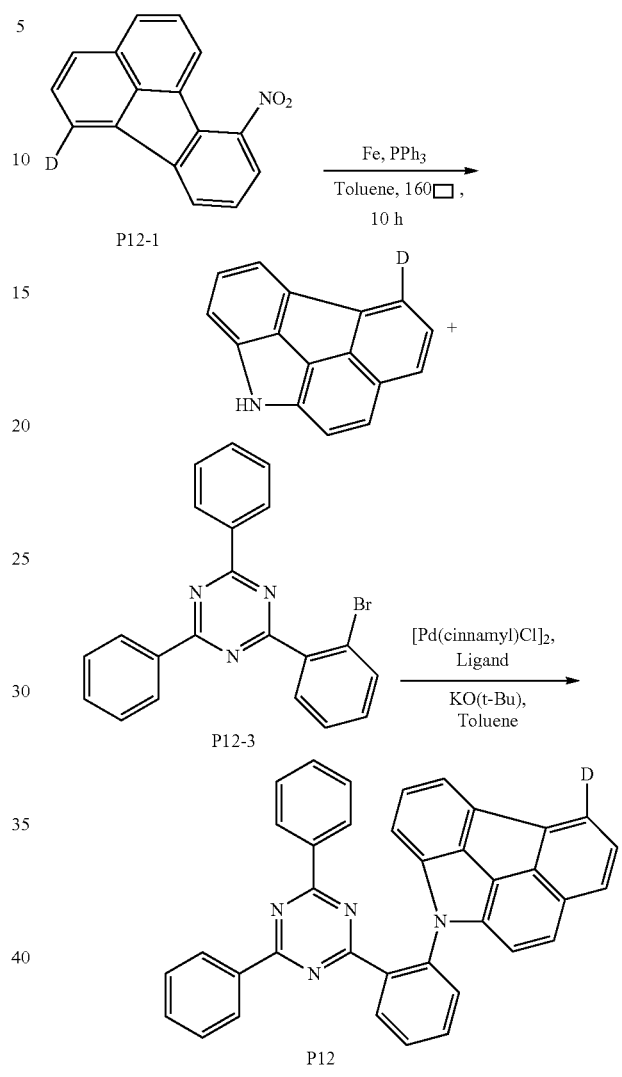

(1) P12-1 (0.5 mmol), iron powder (0.5 mmol) and PPh$_3$ (0.5 mmol) were added to 3 mL of toluene and mixed into a solution, and the solution was put into a 50 mL flask and reacted at 106° C. for 10 h. The solution was cooled to room temperature and slowly added with a saturated aqueous solution of MgSO$_4$ and ethyl acetate to be extracted three times. Then, the organic layer passed through a rotary evaporator to remove the solvent and was subjected to column chromatography to obtain the crude product P12-2.

The structure of the target product P12-2 was tested through matrix-assisted laser desorption/ionization time-of-flight mass spectrometry (MALDI-TOF MS) (m/z) to obtain $C_{16}H_8DN$ whose calculated value was 216.1 and measured value was 216.0.

(2) P12-2 (0.5 mmol), P12-3 (0.75 mmol), KO(t-Bu) (0.75 mmol), [Pd(cinnamyl)Cl]$_2$ (0.02 mol) and Ligand (0.015 mol) were added to 3 mL of toluene and mixed into a solution, and the solution was put into a 50 mL flask and reacted at 80° C. for 12 h. The solution was cooled to room temperature and slowly added with a saturated aqueous solution of MgSO$_4$ and ethyl acetate to be extracted three times. Then, the organic layer passed through a rotary evaporator to remove the solvent and was subjected to column chromatography to obtain the crude product P12.

The structure of the target product P12 was tested through matrix-assisted laser desorption/ionization time-of-flight mass spectrometry (MALDI-TOF MS) (m/z) to obtain $C_{37}H_{21}DN_4$ whose calculated value was 523.2 and measured value was 523.1.

Elemental analysis: calculated value: C, 84.87, H, 4.43, N, 10.70; measured value: C, 84.88, H, 4.42, N, 10.70.

Preparation Example 4

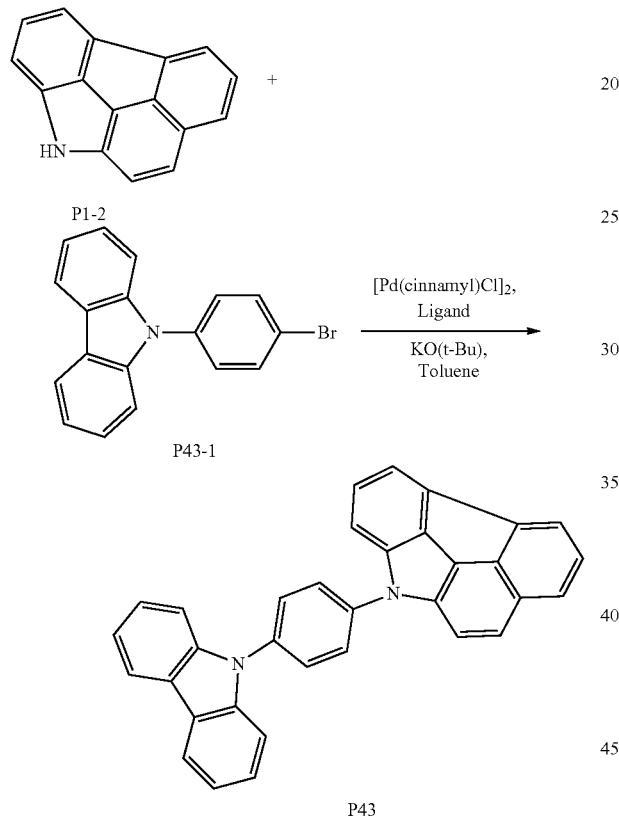

P43

(1) P1-2 (0.5 mmol), P43-1 (0.75 mmol), KO(t-Bu) (0.75 mmol), [Pd(cinnamyl)Cl]$_2$ (0.02 mol) and Ligand (0.015 mol) were added to 3 mL of toluene and mixed into a solution, and the solution was put into a 50 mL flask and reacted at 80° C. for 12 h. The solution was cooled to room temperature and slowly added with a saturated aqueous solution of MgSO$_4$ and ethyl acetate to be extracted three times. Then, the organic layer passed through a rotary evaporator to remove the solvent and was subjected to column chromatography to obtain the crude product P43.

The structure of the target product P43 was tested through matrix-assisted laser desorption/ionization time-of-flight mass spectrometry (MALDI-TOF MS) (m/z) to obtain $C_{34}H_{20}N_2$ whose calculated value was 456.2 and measured value was 456.1.

Elemental analysis: calculated value: C, 89.45, H, 4.42, N, 6.14; measured value: C, 89.45, H, 4.43, N, 6.14.

Preparation Example 5

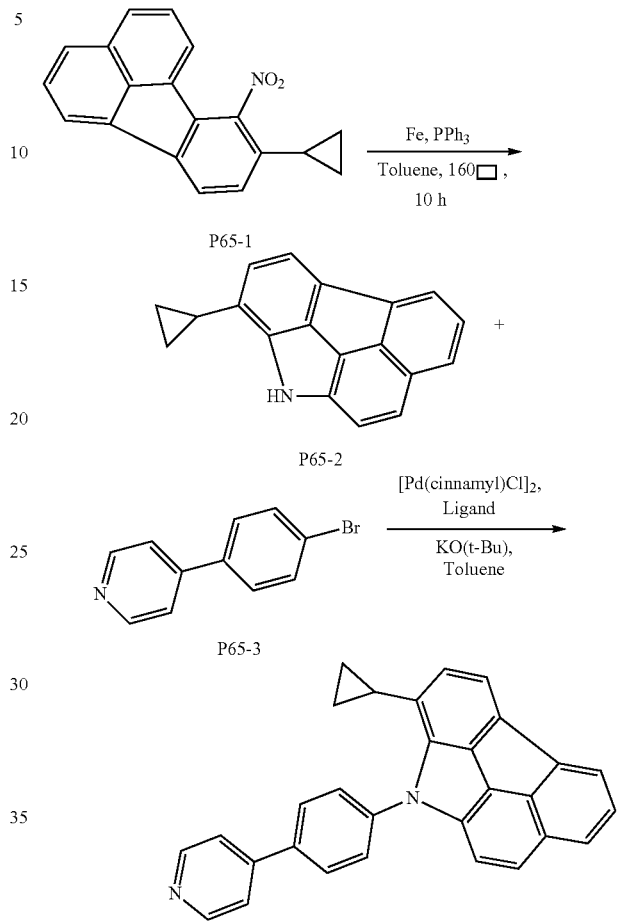

P65

(1) P65-1 (0.5 mmol), iron powder (0.5 mmol) and PPh$_3$ (0.5 mmol) were added to 3 mL of toluene and mixed into a solution, and the solution was put into a 50 mL flask and reacted at 106° C. for 10 h. The solution was cooled to room temperature and slowly added with a saturated aqueous solution of MgSO$_4$ and ethyl acetate to be extracted three times. Then, the organic layer passed through a rotary evaporator to remove the solvent and was subjected to column chromatography to obtain the crude product P65-2.

The structure of the target product P65-2 was tested through matrix-assisted laser desorption/ionization time-of-flight mass spectrometry (MALDI-TOF MS) (m/z) to obtain $C_{19}H_{13}N$ whose calculated value was 255.1 and measured value was 255.0.

(2) P65-2 (0.5 mmol), P65-3 (0.75 mmol), KO(t-Bu) (0.75 mmol), [Pd(cinnamyl)Cl]$_2$ (0.02 mol) and a ligand (0.015 mol) were added to 3 mL of toluene and mixed into a solution, and the solution was put into a 50 mL flask and reacted at 80° C. for 12 h. The solution was cooled to room temperature and slowly added with a saturated aqueous solution of MgSO$_4$ and ethyl acetate to be extracted three times. Then, the organic layer passed through a rotary evaporator to remove the solvent and was subjected to column chromatography to obtain the crude product P65.

The structure of the target product P65 was tested through matrix-assisted laser desorption/ionization time-of-flight mass spectrometry (MALDI-TOF MS) (m/z) to obtain $C_{30}H_{20}N_2$ whose calculated value was 408.2 and measured value was 408.1.

Elemental analysis: calculated value: C, 88.21, H, 4.93, N, 6.86; measured value: C, 88.21, H, 4.94, N, 6.86.

The preparation methods of the compounds of the present disclosure used in specific examples are all similar to the preceding methods and not repeated herein. Only the characterization results of these compounds are provided. The results of mass spectrometry and an elemental analysis are shown in Table 1.

Comparative Example 1: Compound CI

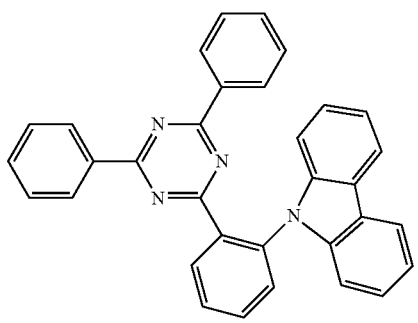

CI

Comparative Example 2: Compound CII

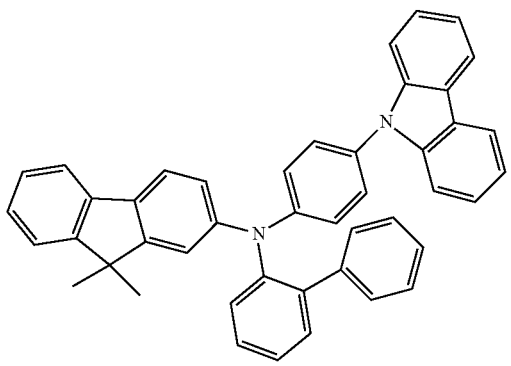

CII

TABLE 1

| | Result of the Mass Spectrometry | | Result of the Elemental Analysis | |
|---|---|---|---|---|
| Compound | Calculated Value | Measured Value | Calculated Value | Measured Value |
| P10 | 596.2 | 596.1 | C, 90.58; H, 4.73; N, 4.69; | C, 90.59; H, 4.73; N, 4.69; |
| P14 | 623.2 | 623.1 | C, 84.73; H, 4.04; N, 11.23; | C, 84.72; H, 4.05; N, 11.23; |
| P18 | 540.2 | 540.1 | C, 82.21; H, 3.92; N, 10.36; | C, 82.21; H, 3.91; N, 10.36; |
| P19 | 590.2 | 590.1 | C, 77.28; H, 3.58; N, 9.49; | C, 77.28; H, 3.58; N, 9.49; |

TABLE 1-continued

| | Result of the Mass Spectrometry | | Result of the Elemental Analysis | |
|---|---|---|---|---|
| Compound | Calculated Value | Measured Value | Calculated Value | Measured Value |
| P22 | 525.2 | 525.1 | C, 84.55; H, 4.41; N, 7.99; | C, 84.56; H, 4.41; N, 7.99; |
| P27 | 444.2 | 444.1 | C, 89.16; H, 4.53; N, 6.30; | C, 89.16; H, 4.52; N, 6.30; |
| P28 | 418.1 | 418.2 | C, 83.24; H, 3.37; N, 13.39; | C, 83.24; H, 3.38; N, 13.39; |
| P29 | 470.2 | 470.1 | C, 84.24; H, 3.86; N, 11.91; | C, 84.24; H, 3.87; N, 11.91; |
| P33 | 468.2 | 468.1 | C, 89.72; H, 4.30; N, 5.98; | C, 89.72; H, 4.31; N, 5.98; |
| P34 | 418.2 | 418.1 | C, 88.97; H, 4.34; N, 6.69; | C, 88.97; H, 4.35; N, 6.69; |
| P38 | 648.2 | 648.1 | C, 87.01; H, 4.35; N, 8.64; | C, 87.01; H, 4.34; N, 8.64; |
| P39 | 367.1 | 367.2 | C, 91.52; H, 4.66; N, 3.81; | C, 91.52; H, 4.67; N, 3.81; |
| P41 | 417.2 | 417.1 | C, 92.06; H, 4.59; N, 3.35; | C, 92.06; H, 4.58; N, 3.35; |
| P42 | 467.2 | 467.1 | C, 92.48; H, 4.53; N, 3.00; | C, 92.48; H, 4.53; N, 3.01; |
| P44 | 546.2 | 546.1 | C, 87.89; H, 4.06; N, 5.12; | C, 87.89; H, 4.05; N, 5.12; |
| P47 | 572.2 | 572.1 | C, 90.18; H, 4.93; N, 4.89; | C, 90.18; H, 4.92; N, 4.89; |
| P48 | 534.2 | 534.1 | C, 89.86; H, 4.90; N, 5.24; | C, 89.86; H, 4.91; N, 5.24; |
| P53 | 650.3 | 650.1 | C, 90.43; H, 5.27; N, 4.30; | C, 90.43; H, 5.27; N, 4.30; |
| P54 | 772.3 | 772.1 | C, 91.68; H, 4.69; N, 3.62; | C, 91.68; H, 4.68; N, 3.62; |
| P57 | 572.2 | 572.1 | C, 85.99; H, 4.22; N, 9.78; | C, 85.99; H, 4.21; N, 9.78; |
| P58 | 488.2 | 488.1 | C, 86.04; H, 4.95; N, 5.73; | C, 86.04; H, 4.96; N, 5.73; |
| P61 | 523.2 | 523.1 | C, 82.58; H, 4.04; N, 13.38; | C, 82.58; H, 4.05; N, 13.38; |
| P64 | 563.2 | 563.1 | C, 87.36; H, 5.19; N, 7.45; | C, 87.36; H, 5.18; N, 7.45; |
| P66 | 523.2 | 523.1 | C, 82.58; H, 4.04; N, 13.38; | C, 82.58; H, 4.03; N, 13.38; |
| CI | 474.2 | 474.1 | C, 83.52; H, 4.67; N, 11.81; | C, 83.52; H, 4.68; N, 11.81; |
| CII | 602.3 | 602.2 | C, 89.67; H, 5.69; N, 4.65; | C, 89.67; H, 5.68; N, 4.66. |

Simulated Calculations of Energy Levels of Compounds

The simulated calculations of the energy levels of the compounds in the devices and comparative examples are conducted by use of a density-functional theory (DFT). The distribution of molecular frontier orbitals HOMO and LUMO was optimized and calculated using Gaussian 09 package (Gaussian Inc.) at a calculation level of B3LYP/6-31G(d). Meanwhile, based on a time-dependent density-functional theory (TDDFT), the lowest singlet energy levels $E_{S1}$ and the lowest triplet energy levels $E_{T1}$ of the compounds were simulated and calculated. The results are shown in Table 2.

TABLE 2

| Results of the simulated calculations of the energy levels of the compounds | | | | | |
|---|---|---|---|---|---|
| | Compound | HOMO (eV) | LUMO (eV) | $E_{S1}$ (eV) | $E_{T1}$ (eV) |
| Example 1 | P1 | −5.53 | −1.81 | 3.15 | 2.44 |
| Example 2 | P5 | −5.50 | −1.80 | 3.14 | 2.37 |
| Example 3 | P10 | −5.13 | −1.74 | 3.12 | 2.35 |
| Example 4 | P12 | −5.53 | −1.82 | 3.16 | 2.44 |

TABLE 2-continued

Results of the simulated calculations
of the energy levels of the compounds

| Compound | | HOMO (eV) | LUMO (eV) | $E_{S1}$ (eV) | $E_{T1}$ (eV) |
|---|---|---|---|---|---|
| Example 5 | P14 | −5.18 | −1.83 | 2.96 | 2.28 |
| Example 6 | P18 | −5.28 | −1.79 | 3.08 | 2.26 |
| Example 7 | P19 | −5.28 | −1.84 | 3.18 | 2.26 |
| Example 8 | P22 | −5.55 | −1.79 | 3.14 | 2.37 |
| Example 9 | P27 | −5.13 | −1.74 | 3.22 | 2.38 |
| Example 10 | P28 | −5.52 | −1.81 | 3.05 | 2.34 |
| Example 11 | P29 | −5.43 | −1.81 | 3.16 | 2.26 |
| Example 12 | P33 | −5.13 | −1.74 | 3.22 | 2.38 |
| Example 13 | P34 | −5.23 | −1.84 | 3.32 | 2.40 |
| Example 14 | P38 | −5.54 | −1.82 | 3.14 | 2.40 |
| Example 15 | P39 | −4.63 | −1.42 | 3.37 | 2.56 |
| Example 16 | P41 | −4.63 | −1.42 | 3.30 | 2.46 |
| Example 17 | P42 | −4.61 | −1.40 | 2.99 | 2.42 |
| Example 18 | P43 | −4.81 | −1.33 | 2.94 | 2.52 |
| Example 19 | P44 | −4.91 | −1.38 | 2.98 | 2.56 |
| Example 20 | P47 | −4.91 | −1.38 | 2.98 | 2.56 |
| Example 21 | P48 | −4.80 | −1.23 | 2.97 | 2.62 |
| Example 22 | P53 | −4.90 | −1.11 | 3.31 | 2.73 |
| Example 23 | P54 | −4.90 | −0.88 | 3.50 | 2.78 |
| Example 24 | P57 | −5.48 | −1.84 | 3.13 | 2.32 |
| Example 25 | P58 | −4.69 | −1.20 | 2.99 | 2.61 |
| Example 26 | P61 | −5.54 | −1.91 | 3.17 | 2.45 |
| Example 27 | P64 | −5.48 | −1.80 | 3.17 | 2.36 |
| Example 28 | P65 | −5.13 | −1.75 | 3.32 | 2.39 |
| Example 29 | P66 | −5.53 | −1.81 | 3.15 | 2.44 |
| Comparative Example 1 | CI | −4.92 | −1.83 | 2.97 | 2.24 |
| Comparative Example 2 | CII | −4.95 | −0.98 | 3.46 | 2.49 |

As can be seen from Table 2, Compounds P39, P41, P42, P43, P44, P47, P48, P53, P54 and P58 provided by the present disclosure have relatively shallow HUMO energy levels (for example, less than −4.91 eV) so that the injection and transport of holes are facilitated. Other materials such as P1, P5, P10, P12, P14, P18, P19, P22, P27 and P28 have suitable HUMO and LUMO energy levels and relatively high lowest triplet energy levels $E_{T1}$ (for example, greater than 2.15 eV) so that the compound is suitable for use as a host material for red light and can improve the electron mobility and the luminescence efficiency of an organic light-emitting device.

Several application examples in which the organic compounds of the present disclosure are applied to the OLED device are described below.

Device Example 1

This application example provides an OLED device (organic light-emitting device). As shown in the FIGURE, the OLED device includes a substrate 1, an ITO anode 2, a hole injection layer 3, a first hole transport layer 41, a second hole transport layer 42, a light-emitting layer 5, an electron transport layer 6, an electron injection layer 7, a cathode 8 (magnesium-silver electrode, where a mass ratio of magnesium to silver is 1:9) and a capping layer (CPL) 9, which are stacked in sequence. An arrow in the figure represents a light emission direction.

The OLED device was prepared by the specific steps below.

(1) A glass substrate having an indium tin oxide (ITO) anode (with a thickness of 15 nm) was cut into a size of 50 mm×50 mm×0.7 mm, sonicated in isopropyl alcohol and deionized water for 30 minutes separately, and then exposed to ozone for about 10 minutes for cleaning. The cleaned glass substrate was installed onto a vacuum deposition apparatus.

(2) A material of the hole injection layer (Compound b) and a p-type doping material (Compound a) were co-evaporated by means of vacuum evaporation on the ITO anode layer at a doping ratio (mass ratio) of 3% for use as the hole injection layer with a thickness of 5 nm.

(3) A hole transport material (Compound c) was vacuum evaporated on the hole injection layer for use as the first hole transport layer with a thickness of 100 nm.

(4) A hole transport material (Compound d) was vacuum evaporated on the first hole transport layer for use as the second hole transport layer with a thickness of 5 nm.

(5) Light-emitting host materials (Compound P1 and Compound e (with a ratio of 1:1)) and a doping material (Compound 0 were vacuum co-evaporated on the second hole transport layer at a doping ratio (mass ratio) of 3% for use as the light-emitting layer with a thickness of 30 nm.

(6) Compound g was vacuum evaporated on the light-emitting layer for use as the electron transport layer with a thickness of 30 nm.

(7) Compound h and an n-type doping material (Compound i) were vacuum co-evaporated on the electron transport layer at a doping ratio (mass ratio) of 1:1 for use as the electron injection layer with a thickness of 5 nm.

(8) The magnesium-silver electrode was vacuum evaporated on the electron injection layer for use as the cathode with a thickness of 10 nm, where the mass ratio of Mg to Ag was 1:9.

(9) Compound j was vacuum evaporated on the cathode for use as the capping layer with a thickness of 100 nm.

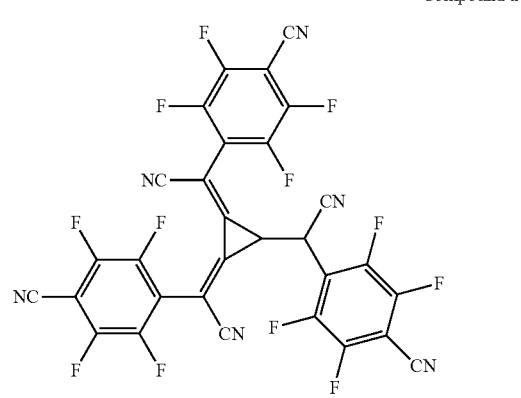

Compound a

Compound b
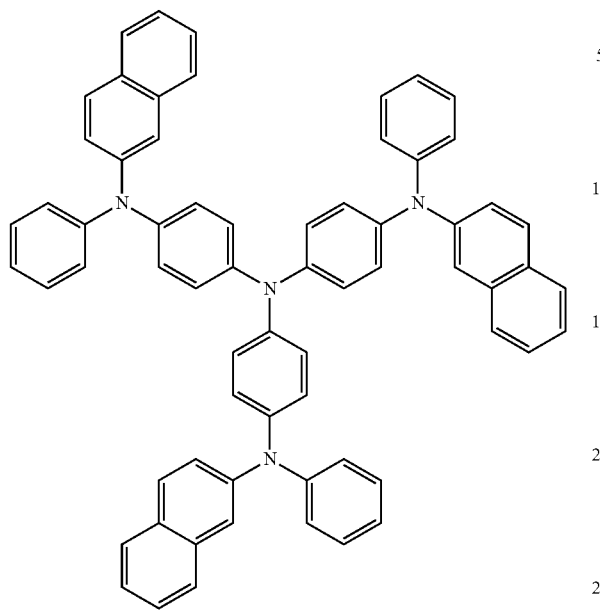
Compound c
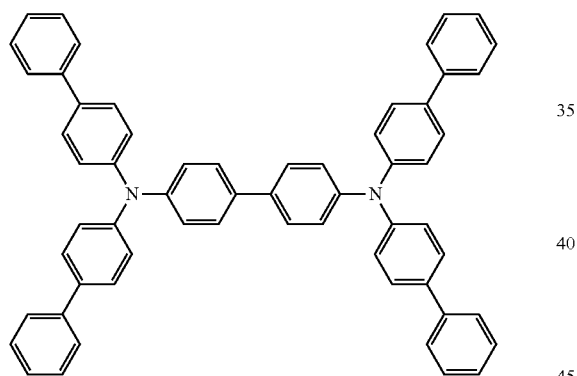
Compound d
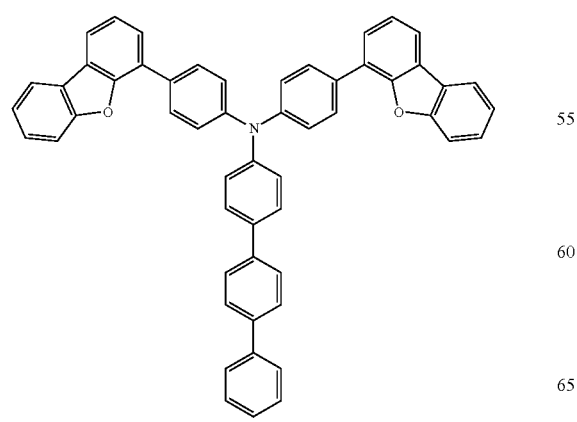
Compound e
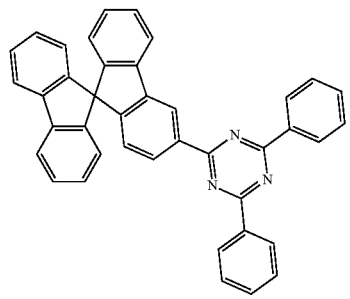
Compound f
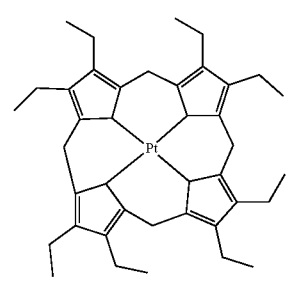
Compound g
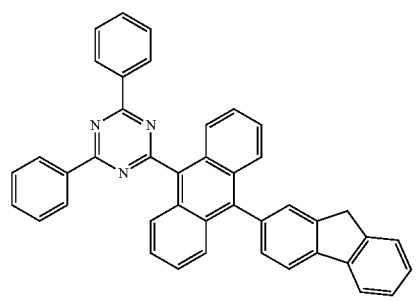
Compound h
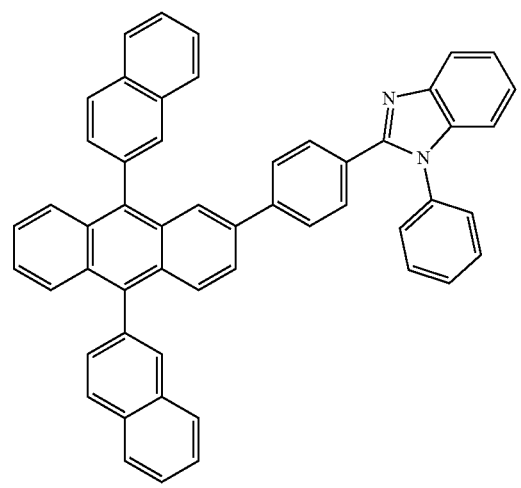
Compound i
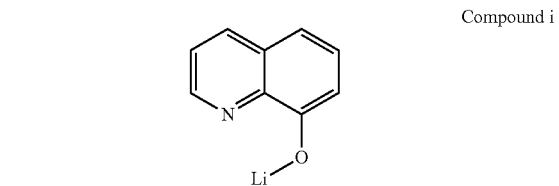

-continued

Compound j

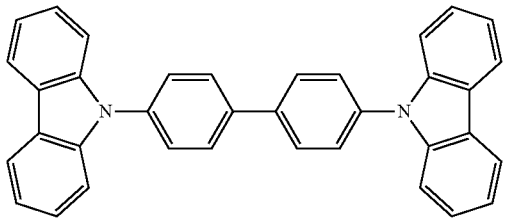

Application Examples 2 to 14, 24 and 26 to 29 and Application Comparative Example 1

These examples are similar to Application Example 1 except a difference that Compound P1 in step (5) was replaced with the compounds in Examples 2 to 14, 24 and 26 to 29 and Comparative Example 1, separately.

Application Examples 15 to 23 and 25 and Application Comparative Example 2

These examples are similar to Application Example 1 except a difference that Compound c in step (3) was replaced with the compounds in Examples 15 to 23 and 25 and Comparative Example 2, separately.

A Keithley 2365A digital nanovoltmeter was used for testing currents of the OLED device at different voltages, and then the currents were divided by a luminescence area to obtain current densities of the OLED device at different voltages. A Konicaminolta CS-2000 spectroradiometer was used for testing the brightness and radiation energy flux densities of the OLED device at different voltages. According to the current densities and brightness of the OLED device at different voltages, a working voltage and current efficiency (CE) (10 mA/cm$^2$, cd/A) at the same current density (10 mA/cm$^2$) were obtained, where Von denotes the turn-on voltage when the brightness is 1 cd/m$^2$. A lifetime LT95 was obtained (under a testing condition of 50 mA/cm$^2$) by measuring the time taken for the OLED device to reach 95% of its initial brightness. Test data is shown in Table 3.

TABLE 3

Results of performance detection of OLED devices

| OLED Device | Compound | Von (V) | CE (10 mA/cm$^2$) (cd/A) | Lifetime LT$_{95}$ (h) |
|---|---|---|---|---|
| Application Example 1 | P1 | 3.81 | 42.0 | 104 |
| Application Example 2 | P5 | 3.83 | 42.2 | 116 |
| Application Example 3 | P10 | 3.74 | 45.6 | 105 |
| Application Example 4 | P12 | 3.78 | 41.6 | 108 |
| Application Example 5 | P14 | 3.82 | 45.3 | 99 |
| Application Example 6 | P18 | 3.75 | 36.3 | 112 |
| Application Example 7 | P19 | 3.85 | 43.1 | 103 |
| Application Example 8 | P22 | 3.75 | 42.3 | 98 |
| Application Example 9 | P27 | 3.81 | 39.2 | 102 |
| Application Example 10 | P28 | 3.80 | 39.6 | 111 |
| Application Example 11 | P29 | 3.89 | 38.4 | 114 |
| Application Example 12 | P33 | 3.88 | 40.1 | 106 |
| Application Example 13 | P34 | 3.86 | 40.5 | 105 |
| Application Example 14 | P38 | 3.79 | 40.3 | 107 |
| Application Example 15 | P39 | 3.93 | 36.3 | 86 |
| Application Example 16 | P41 | 3.94 | 36.2 | 79 |
| Application Example 17 | P42 | 3.95 | 36.1 | 96 |
| Application Example 18 | P43 | 3.90 | 36.9 | 83 |
| Application Example 19 | P44 | 3.93 | 37.0 | 84 |
| Application Example 20 | P47 | 3.95 | 36.8 | 83 |
| Application Example 21 | P48 | 3.91 | 37.3 | 78 |
| Application Example 22 | P53 | 3.90 | 37.6 | 79 |
| Application Example 23 | P54 | 3.90 | 37.5 | 86 |
| Application Example 24 | P57 | 3.86 | 39.5 | 103 |
| Application Example 25 | P58 | 3.93 | 36.9 | 85 |
| Application Example 26 | P61 | 3.79 | 39.3 | 101 |
| Application Example 27 | P64 | 3.83 | 39.5 | 104 |
| Application Example 28 | P65 | 3.86 | 39.7 | 97 |
| Comparative Example 1 | CI | 4.09 | 28.6 | 70 |
| Comparative Example 2 | CII | 4.36 | 23.9 | 56 |

As can be seen from Table 3, the OLED device provided by the present disclosure has a relatively low driving voltage, relatively high luminescence efficiency and a relatively long service life due to the use of the compound of the present disclosure as the host material for red light or the material of the hole transport layer. For example, the turn-on voltage may be less than or equal to 3.89 V, or less than or equal to 3.95 V; the current efficiency (CE) (10 mA/cm$^2$) may be greater than or equal to 45.6 cd/A or greater than or equal to 37.6 cd/A; and the lifetime LT95 may be greater than or equal to 78 h. Compared with those in Comparative Examples 1 and 2, the OLED device of the present disclosure has significantly improved performance. The main reasons are as follows: the organic compound provided by the present disclosure has suitable HOMO and LUMO energy levels and a relatively high triplet energy level and can improve a hole injection ability so that the organic light-emitting device using the organic compound as the host material for red light or the material of the hole transport layer can obtain a relatively low driving voltage and relatively high luminescence efficiency; meanwhile, the organic compound provided by the present disclosure also has good thermal stability and film formability, which is conducive to the stability of the device, prolonging the lifetime of the device.

The applicant has stated that although the organic compound and the application thereof in the present disclosure are described through the preceding embodiments, the present disclosure is not limited to the preceding embodiments, which means that the implementation of the present disclosure does not necessarily depend on the preceding embodiments. It should be apparent to those skilled in the art that any improvements made to the present disclosure, equivalent replacements of raw materials of the product, additions of adjuvant ingredients, selections of specific methods, etc. in the present disclosure all fall within the protection scope and the disclosure scope of the present disclosure.

What is claimed is:

1. An organic compound, wherein the organic compound has a structure represented by Formula I:

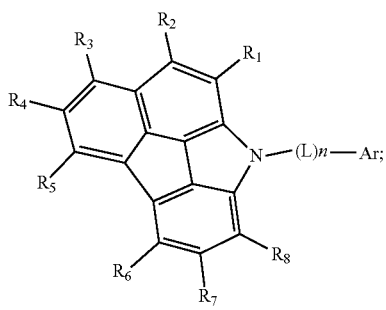

Formula I wherein $R_1$ to $R_8$ are each independently selected from H, substituted or unsubstituted C1 to C10 alkyl, substituted or unsubstituted C1 to C10 cycloalkyl, substituted or unsubstituted C1 to C10 alkoxy, substituted or unsubstituted C6 to C30 aryl, substituted or unsubstituted C6 to C30 aryloxy, substituted or unsubstituted C3 to C30 heteroaryl, —OR$^9$ or —SR$^9$;

$R^9$ is selected from H, substituted or unsubstituted C1 to C10 alkyl, substituted or unsubstituted C1 to C10 cycloalkyl, substituted or unsubstituted C6 to C30 aryl, or substituted or unsubstituted C3 to C30 heteroaryl;

L is selected from a linkage bond, substituted or unsubstituted C6 to C30 aryl or substituted or unsubstituted C3 to C30 heteroaryl;

n is an integer from 0 to 3, and Ar is selected from substituted or unsubstituted C6 to C30 aryl, or substituted or unsubstituted C3 to C30 heteroaryl.

2. The organic compound according to claim 1, wherein a substituent in the substituted C1 to C10 alkyl, substituted C1 to C10 cycloalkyl, substituted C1 to C10 alkoxy, substituted C6 to C30 aryl, substituted C6 to C30 aryloxy, or substituted C3 to C30 heteroaryl is selected from deuterium, fluorine, trifluoromethyl, cyano, methyl, ethyl, t-butyl, isopropyl or methoxy.

3. The organic compound according to claim 1, wherein the organic compound has a structure represented by Formula II:

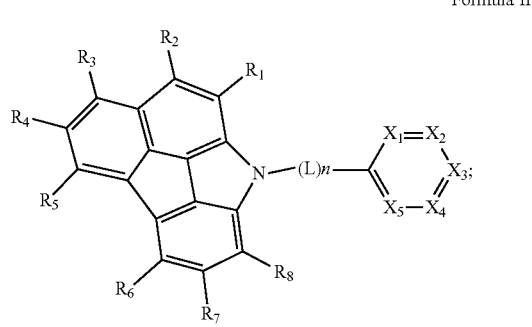

Formula II wherein $X_1$ to $X_5$ are each independently selected from N or $CR_A$, and each $R_A$ is independently selected from H, substituted or unsubstituted C1 to C10 alkyl, substituted or unsubstituted C1 to C10 cycloalkyl, substituted or unsubstituted C6 to C30 aryl, or substituted or unsubstituted C3 to C30 heteroaryl; and $R_1$ to $R_8$, L and n are defined the same as those in Formula I.

4. The organic compound according to claim 1, wherein the organic compound has a structure represented by Formula III:

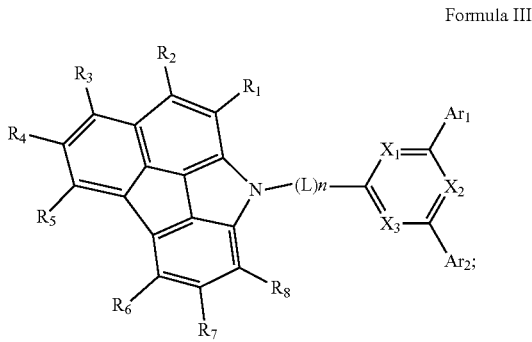

Formula III wherein $X_1$ to $X_3$ are each independently selected from N or $CR_A$, and each $R_A$ is independently selected from H, substituted or unsubstituted C1 to C10 alkyl, substituted or unsubstituted C1 to C10 cycloalkyl, substituted or unsubstituted C6 to C30 aryl or substituted or unsubstituted C3 to C30 heteroaryl; and $Ar_1$ and $Ar_2$ are independently selected from substituted or unsubstituted C6 to C30 aryl, or substituted or unsubstituted C3 to C30 heteroaryl;

$R_1$ to $R_8$, L and n are defined the same as those in Formula I.

5. The organic compound according to claim 1, wherein the organic compound has a structure represented by Formula IV:

Formula IV

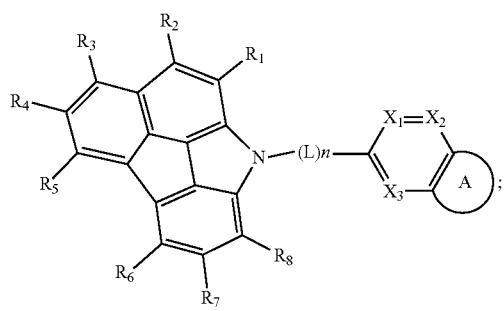

wherein $X_1$ to $X_3$ are each independently selected from N or $CR_A$, and each $R_A$ is independently selected from H, substituted or unsubstituted C1 to C10 alkyl, substituted or unsubstituted C1 to C10 cycloalkyl, substituted or unsubstituted C6 to C30 aryl or substituted or unsubstituted C3 to C30 heteroaryl; and A is selected from substituted or unsubstituted C6 to C30 aryl or substituted or unsubstituted C3 to C30 heteroaryl;

$R_1$ to $R_8$, L and n are defined the same as those in Formula I.

6. The organic compound according to claim 1, wherein $R_1$ to $R_8$ are each independently selected from H, deuterium, fluorine, trifluoromethyl, cyano, methyl, ethyl, t-butyl, isopropyl, cyclopropyl, cyclopentyl, methoxy, phenyl, cyano-substituted phenyl, pyridyl or phenoxy.

7. The organic compound according to claim 1, wherein L is selected from a single bond, substituted or unsubstituted phenylene, substituted or unsubstituted biphenylene, substituted or unsubstituted naphthylene, substituted or unsubstituted phenylene-naphthylene, substituted or unsubstituted phenanthrylene, substituted or unsubstituted pyridylene, or substituted or unsubstituted pyridylene-pyridylene.

8. The organic compound according to claim 1, wherein Ar is selected from substituted or unsubstituted phenyl, substituted or unsubstituted phenanthryl, substituted or unsubstituted pyridyl, substituted or unsubstituted triazinyl, substituted or unsubstituted benzopyrimidinyl, or substituted or unsubstituted arylamine;
wherein a substituent in the substituted group is selected from C6 to C30 aryl.

9. The organic compound according to claim 8, wherein Ar is selected from

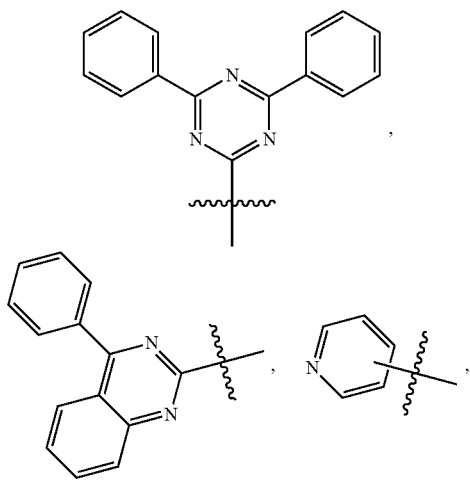

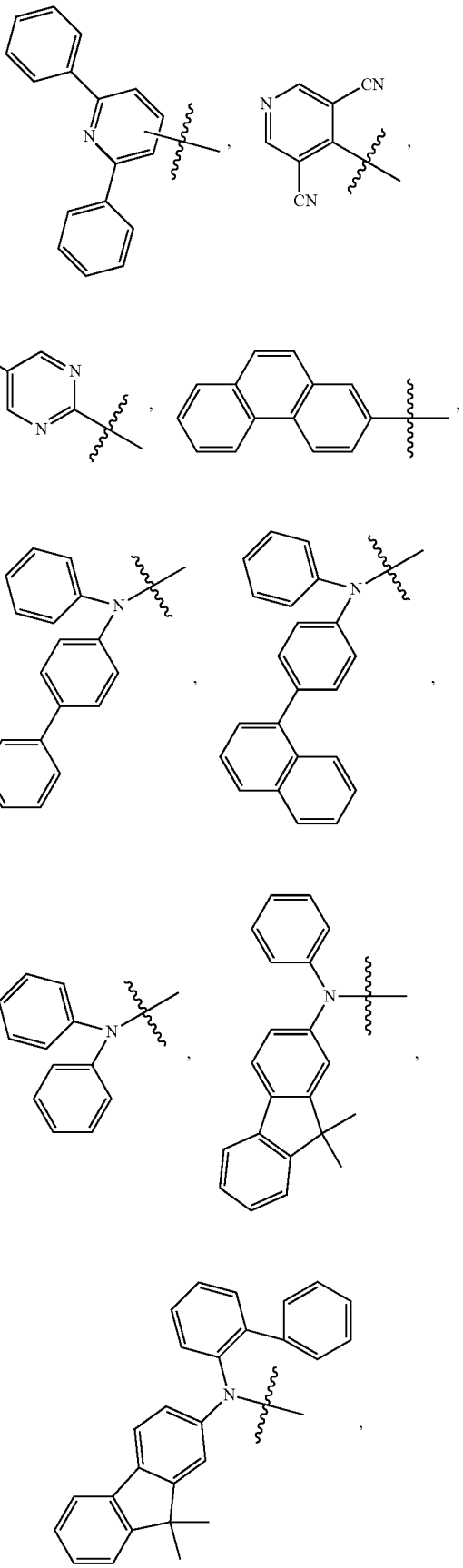

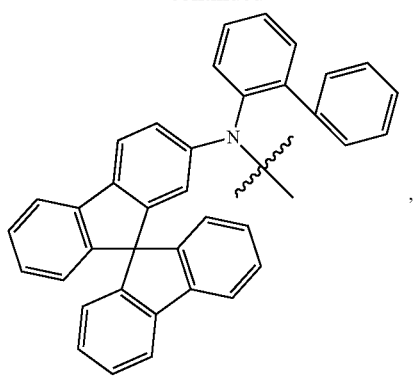
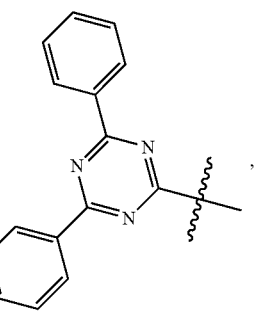
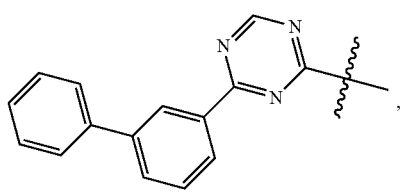
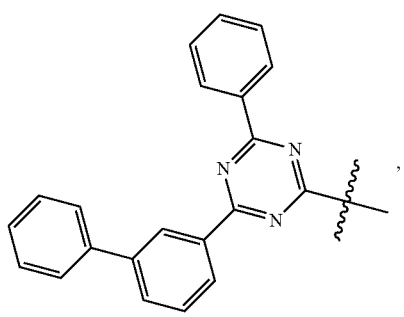
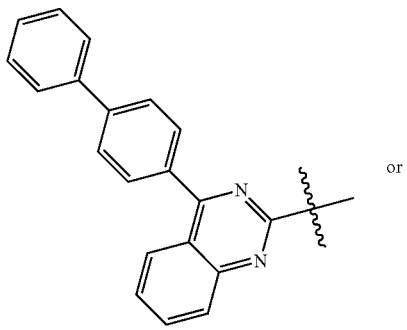
, or
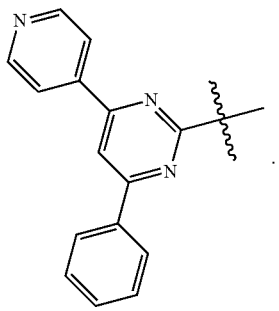
10. The organic compound according to claim 5, wherein the ring A is selected from a benzene ring or a naphthalene ring.
11. The organic compound according to claim 1, wherein the organic compound is any one of the following compounds:
P1
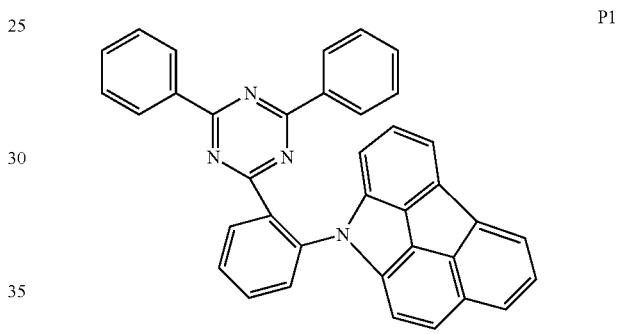
P2
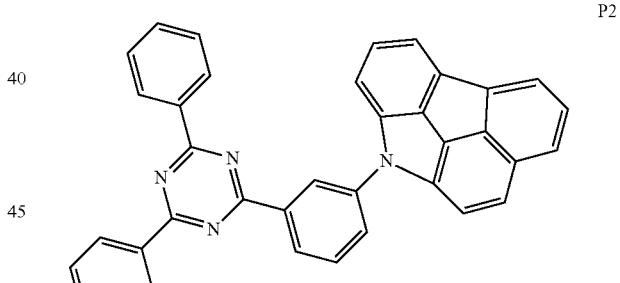
P3
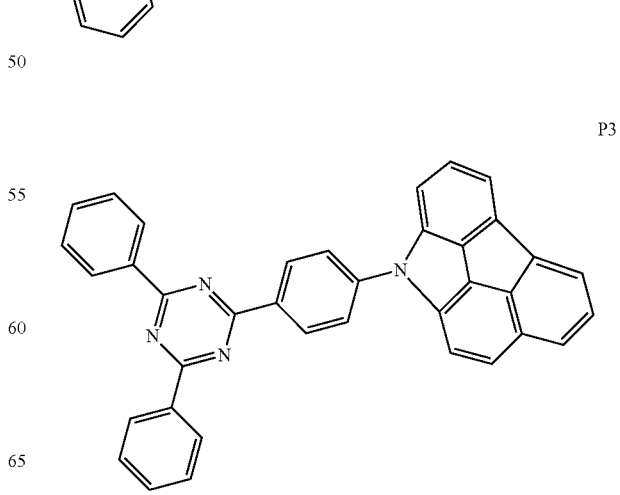

P9
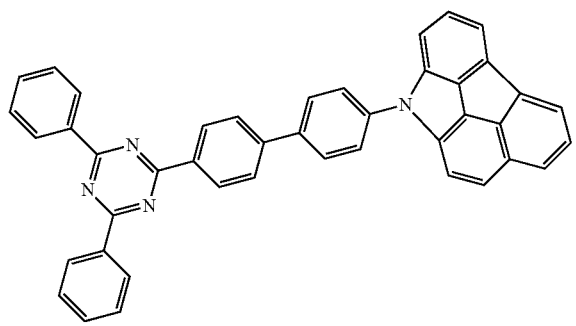
P13
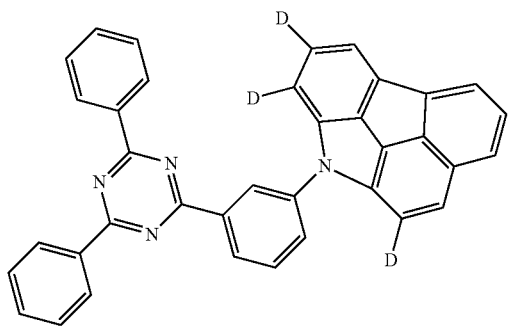
P10
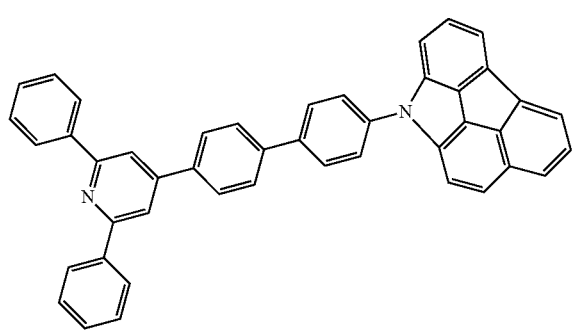
P14
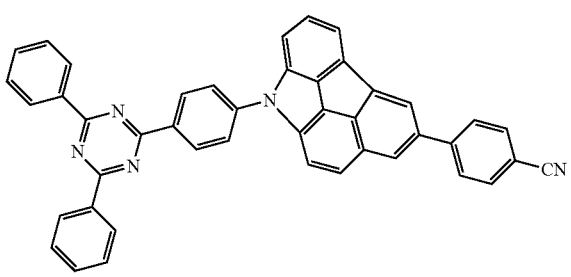
P11
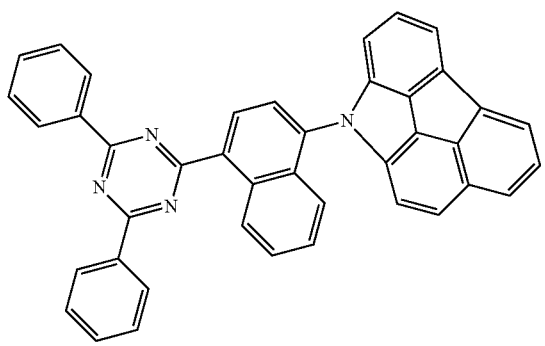
P15
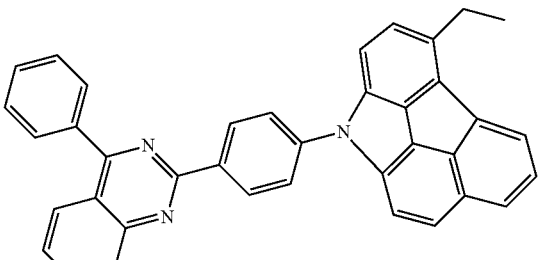
P16
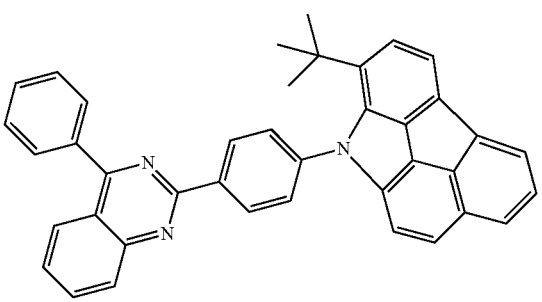
P12
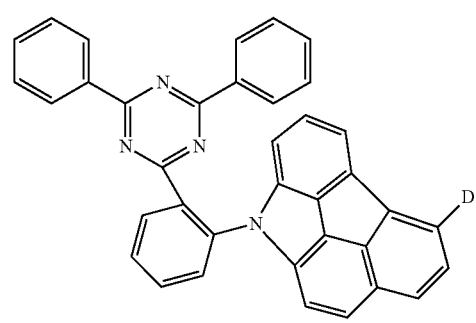
P17
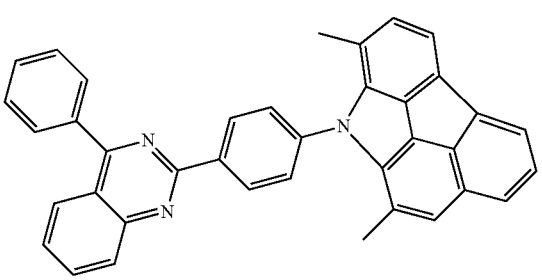

P18
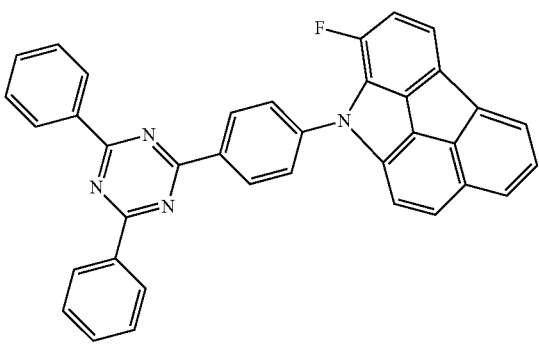
P19
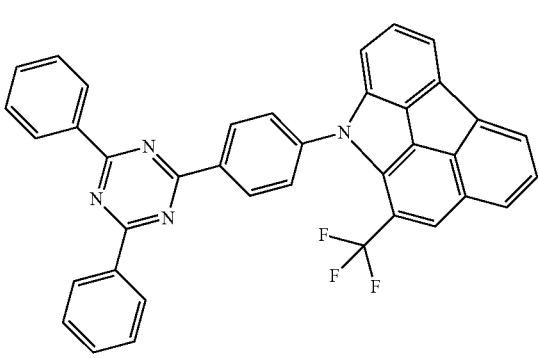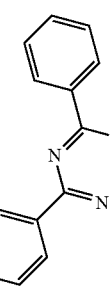
P20
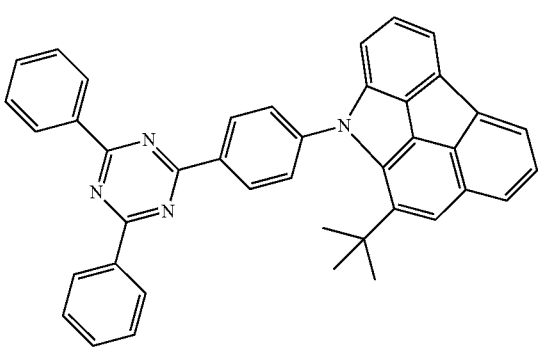
P21
P23
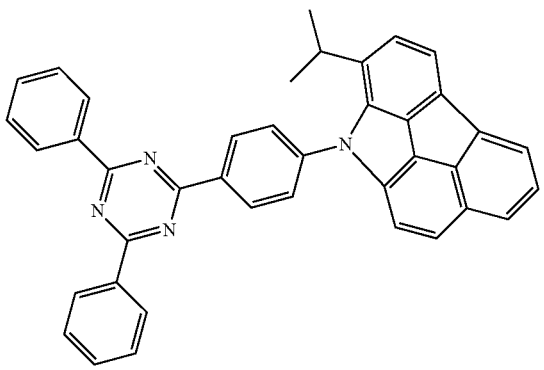
P24
P25
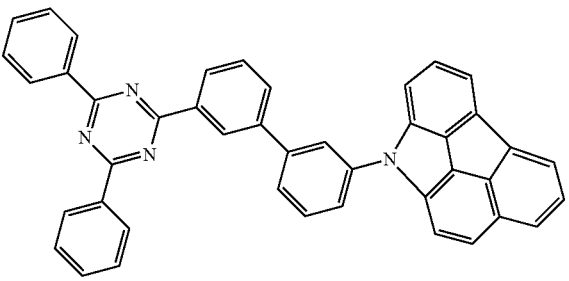
P26
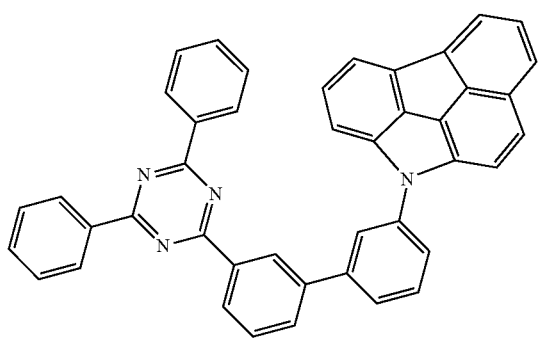
P27
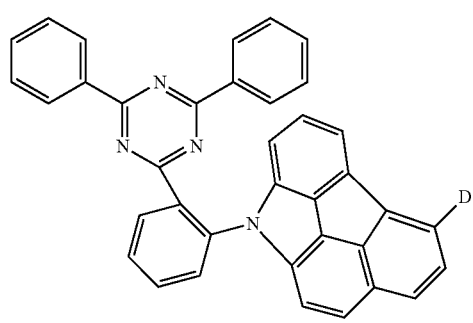
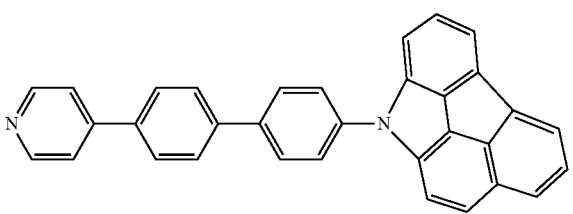

P28
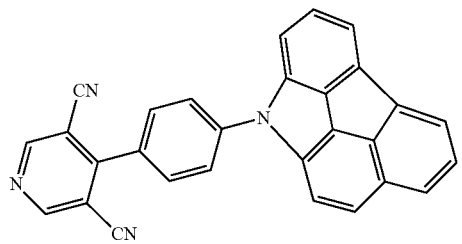
P29
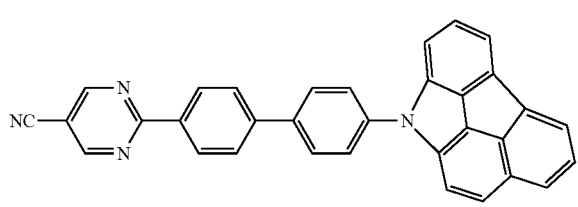
P33
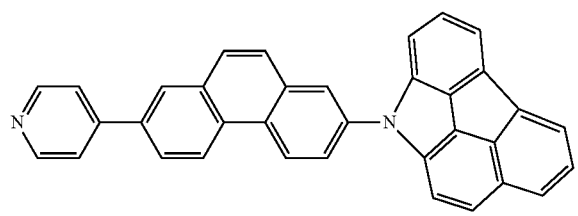
P34
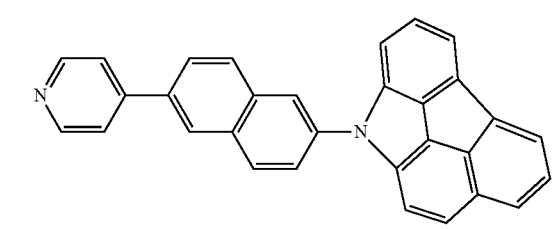
P35
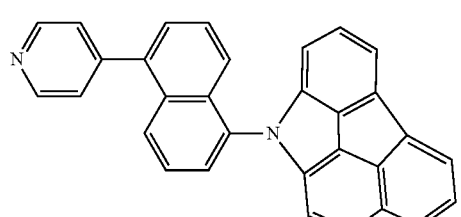
P36
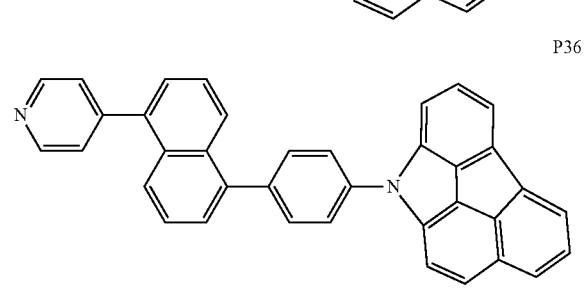
P37
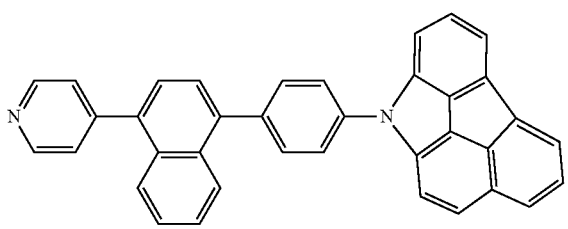
P38
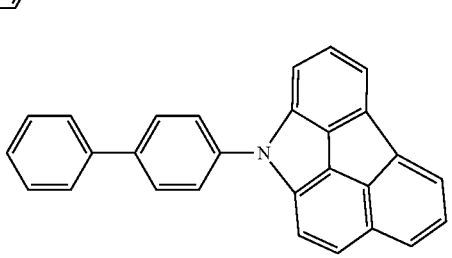
P39
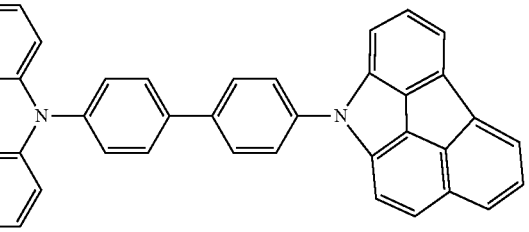
P48
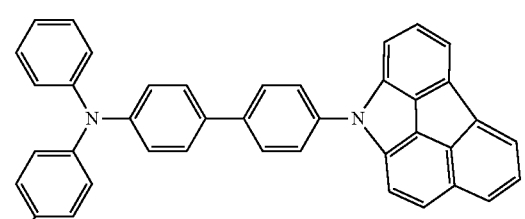
P49
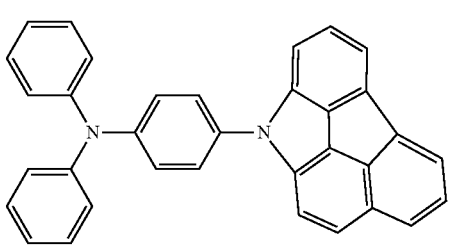
P50

P58 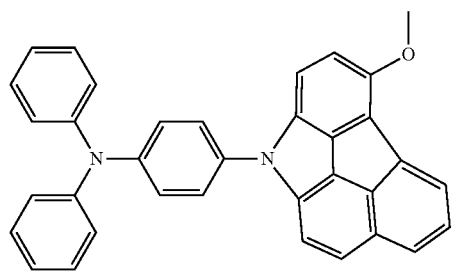
P63 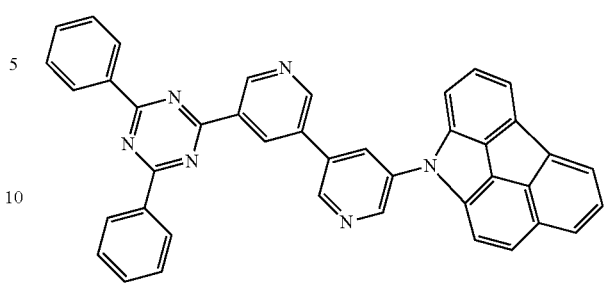
P59 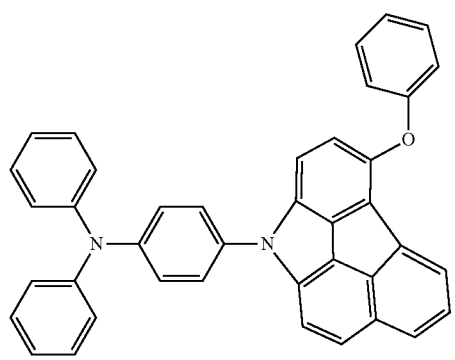
P65 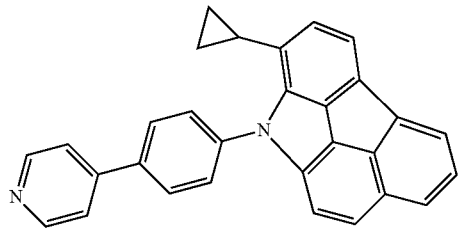
P60 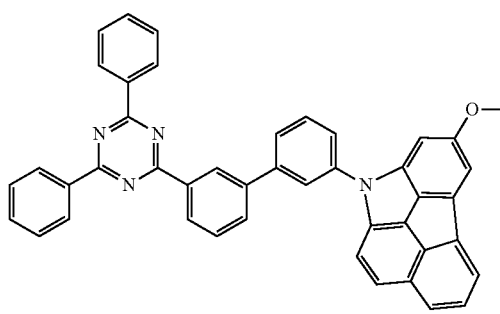
P66 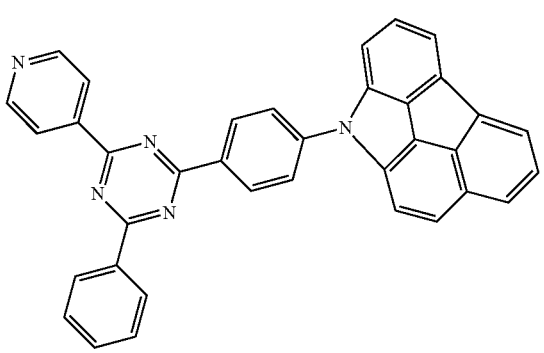
P61 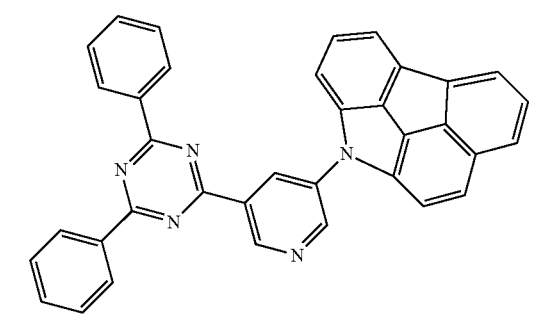
P67 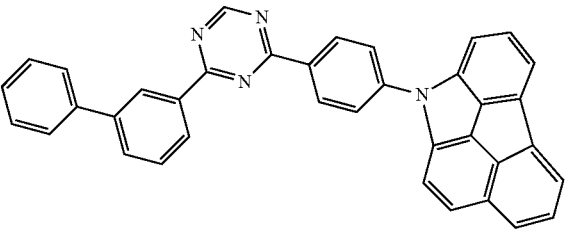
P62 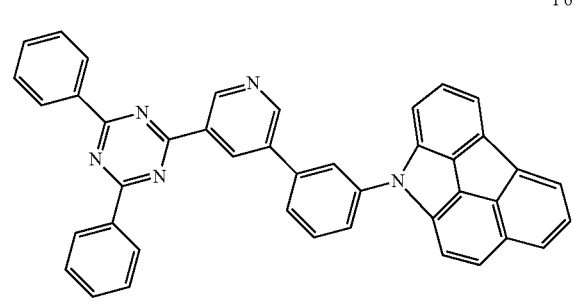
P68 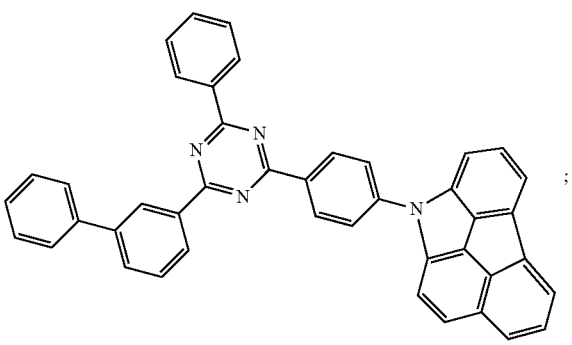
wherein D represents deuterium.
12. The organic compound according to claim 1, wherein the organic compound is any one of the following compounds:

P4
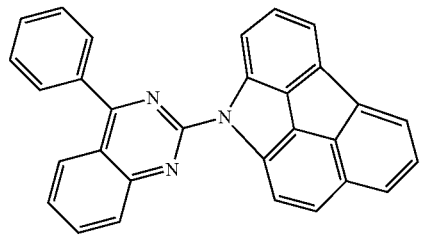
P8
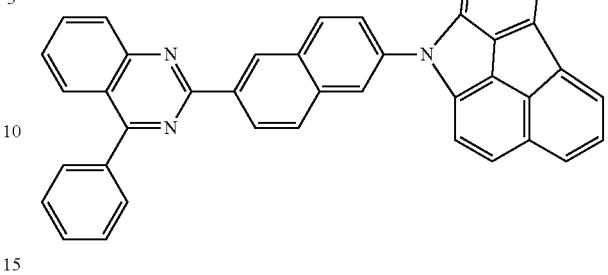
P5
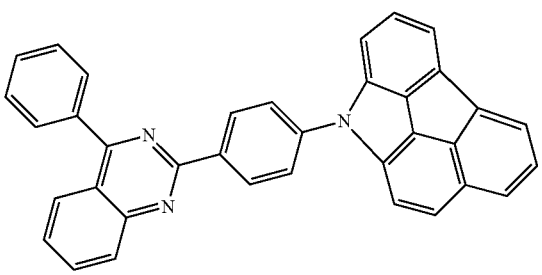
P15
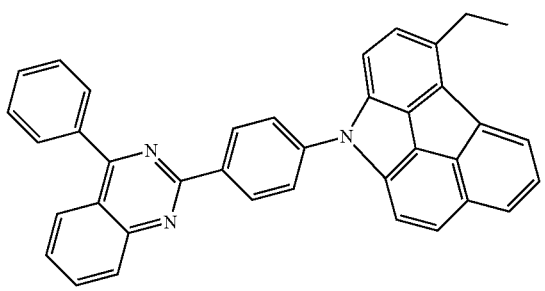
P6
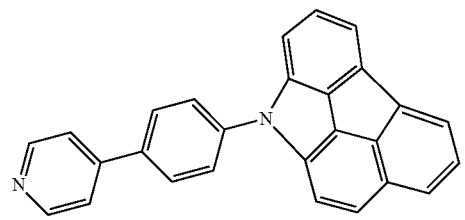
P16
P5
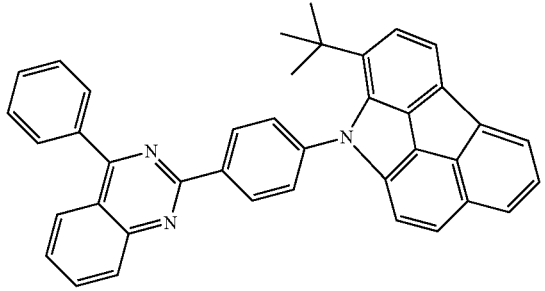
P6
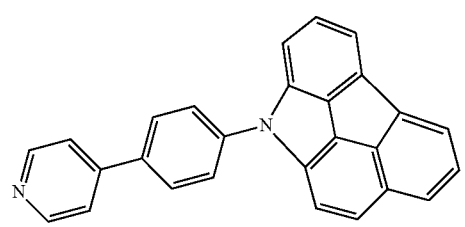
P17
P7
P22
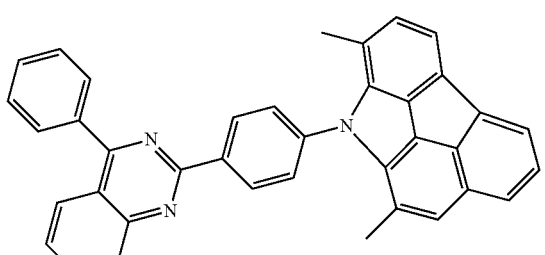

P30
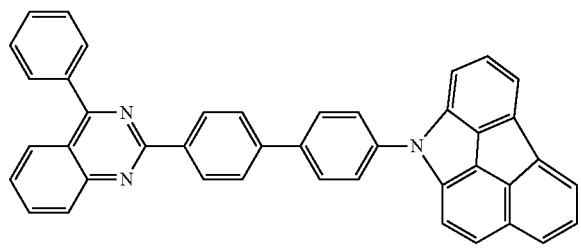
P31
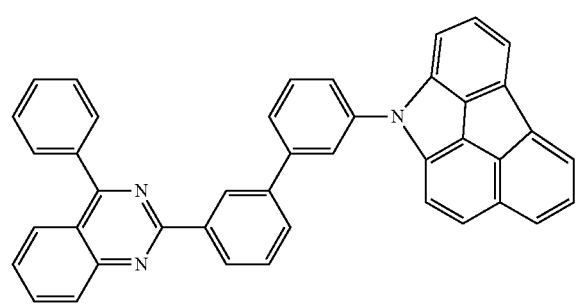
P32
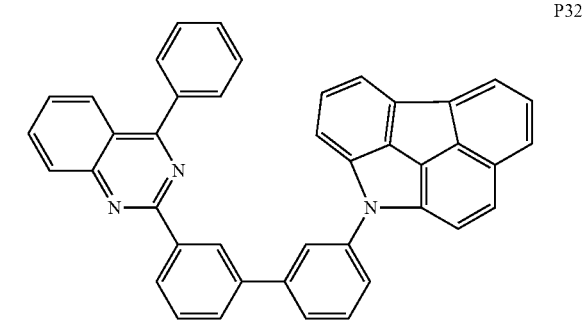
P40
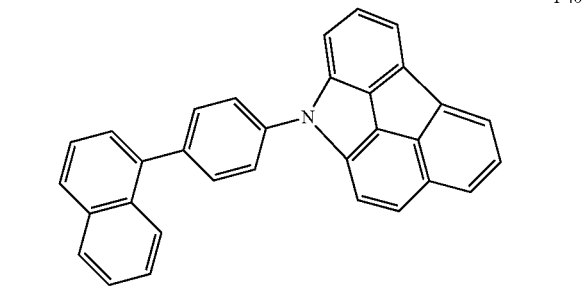
P41
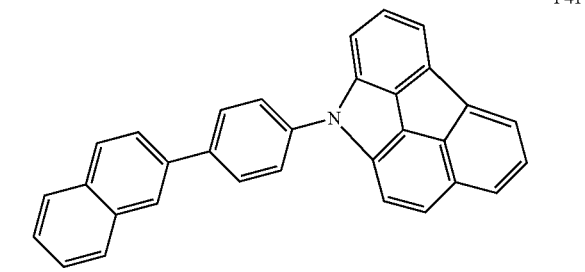
P42
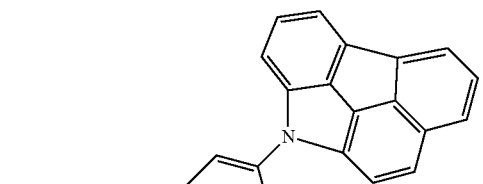
P43
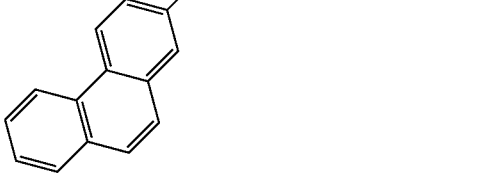
P44
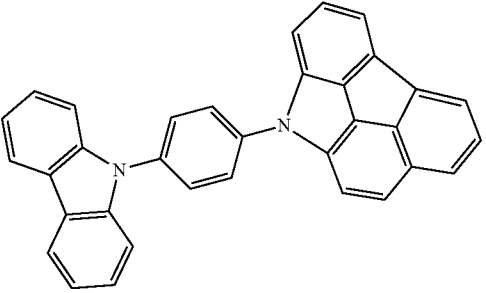
P45
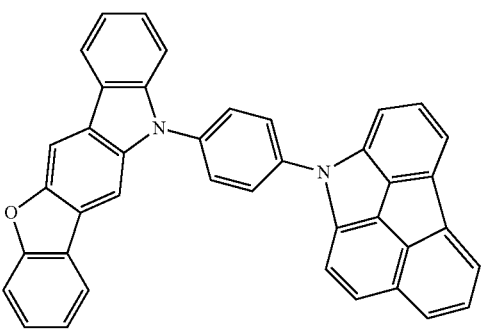

-continued
P46
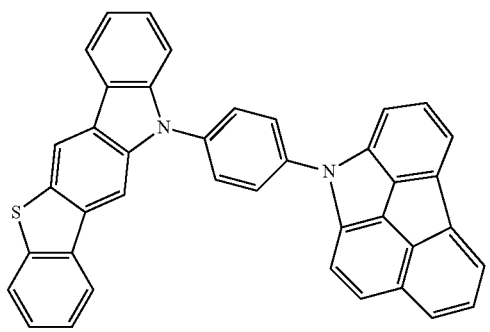
P47
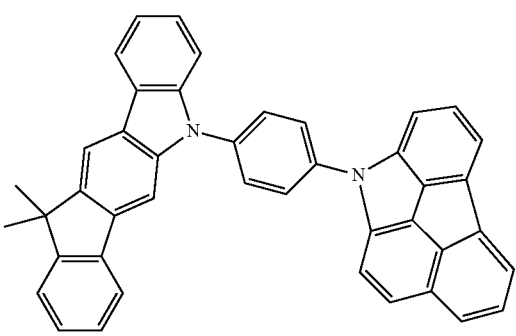
P51
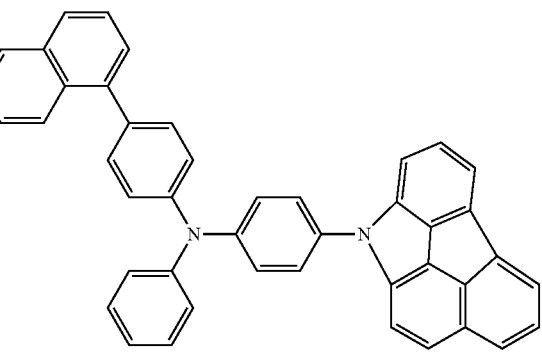
P52
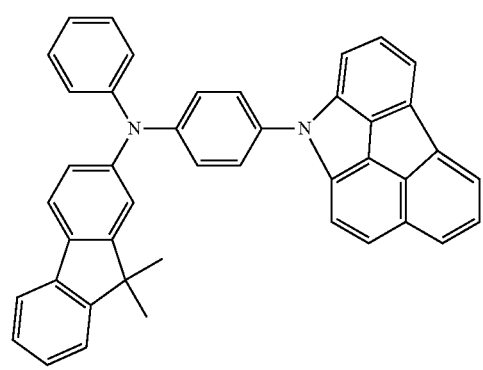
-continued
P53
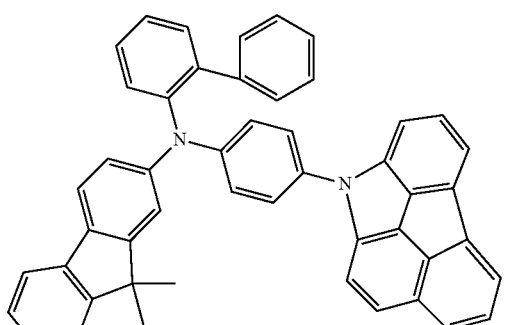
P54
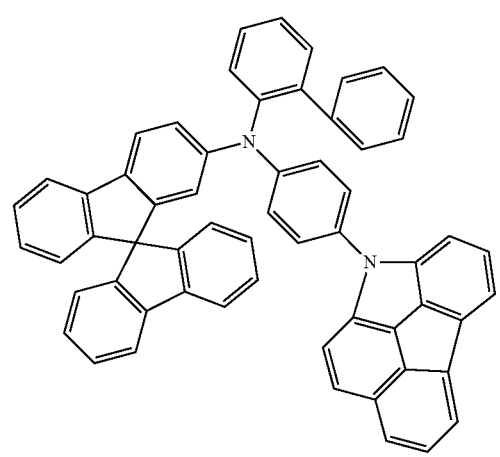
P55
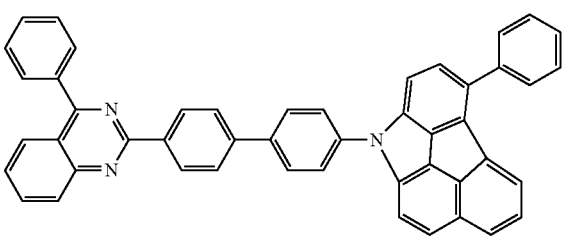
P56
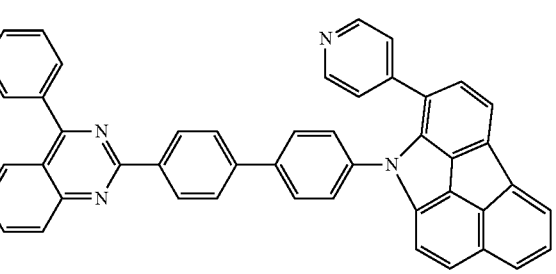
P57
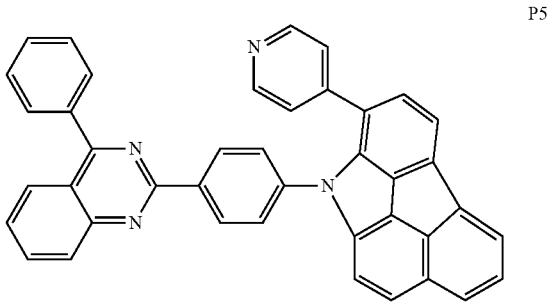

-continued

P64

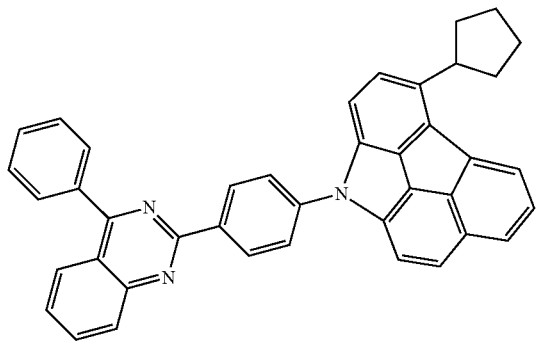

or

P69

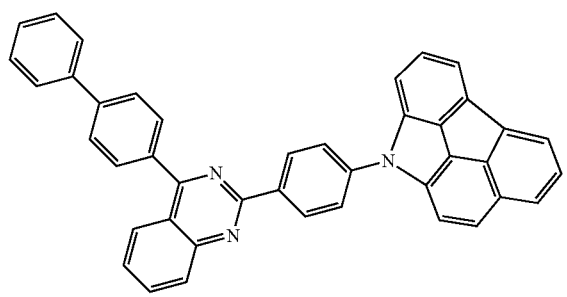

13. An organic electroluminescent material, comprising an organic compound, wherein the organic compound has a structure represented by Formula I:

Formula I

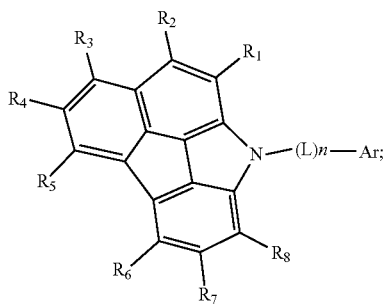

wherein $R_1$ to $R_8$ are each independently selected from H, substituted or unsubstituted C1 to C10 alkyl, substituted or unsubstituted C1 to C10 cycloalkyl, substituted or unsubstituted C1 to C10 alkoxy, substituted or unsubstituted C6 to C30 aryl, substituted or unsubstituted C6 to C30 aryloxy, substituted or unsubstituted C3 to C30 heteroaryl, —$OR^9$ or —$SR^9$;

$R^9$ is selected from H, substituted or unsubstituted C1 to C10 alkyl, substituted or unsubstituted C1 to C10 cycloalkyl, substituted or unsubstituted C6 to C30 aryl, or substituted or unsubstituted C3 to C30 heteroaryl;

L is selected from a linkage bond, substituted or unsubstituted C6 to C30 aryl or substituted or unsubstituted C3 to C30 heteroaryl;

n is an integer from 0 to 3, and Ar is selected from substituted or unsubstituted C6 to C30 aryl, or substituted or unsubstituted C3 to C30 heteroaryl.

14. An organic light-emitting diode (OLED) device, comprising an anode, a cathode and an organic thin film layer disposed between the anode and the cathode, wherein a material of the organic thin film layer comprises an organic electroluminescent material, wherein the organic electroluminescent material comprises an organic compound, wherein the organic compound has a structure represented by Formula I:

Formula I

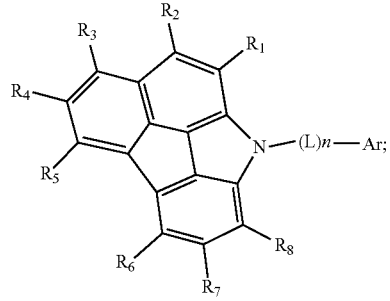

wherein $R_1$ to $R_8$ are each independently selected from H, substituted or unsubstituted C1 to C10 alkyl, substituted or unsubstituted C1 to C10 cycloalkyl, substituted or unsubstituted C1 to C10 alkoxy, substituted or unsubstituted C6 to C30 aryl, substituted or unsubstituted C6 to C30 aryloxy, substituted or unsubstituted C3 to C30 heteroaryl, —$OR^9$ or —$SR^9$;

$R^9$ is selected from H, substituted or unsubstituted C1 to C10 alkyl, substituted or unsubstituted C1 to C10 cycloalkyl, substituted or unsubstituted C6 to C30 aryl, or substituted or unsubstituted C3 to C30 heteroaryl;

L is selected from a linkage bond, substituted or unsubstituted C6 to C30 aryl or substituted or unsubstituted C3 to C30 heteroaryl;

n is an integer from 0 to 3, and Ar is selected from substituted or unsubstituted C6 to C30 aryl, or substituted or unsubstituted C3 to C30 heteroaryl.

15. The OLED device according to claim 14, wherein the organic thin film layer comprises a light-emitting layer which comprises an organic compound as a host material, wherein the organic compound has a structure represented by Formula I:

Formula I

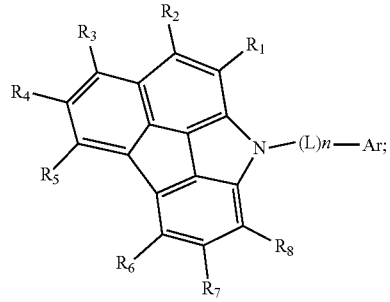

wherein $R_1$ to $R_8$ are each independently selected from H, substituted or unsubstituted C1 to C10 alkyl, substituted or unsubstituted C1 to C10 cycloalkyl, substituted or unsubstituted C1 to C10 alkoxy, substituted or unsubstituted C6 to C30 aryl, substituted or unsubstituted C6 to C30 aryloxy, substituted or unsubstituted C3 to C30 heteroaryl, —$OR^9$ or —$SR^9$;

$R^9$ is selected from H, substituted or unsubstituted C1 to C10 alkyl, substituted or unsubstituted C1 to C10 cycloalkyl, substituted or unsubstituted C6 to C30 aryl, or substituted or unsubstituted C3 to C30 heteroaryl;

L is selected from a linkage bond, substituted or unsubstituted C6 to C30 aryl or substituted or unsubstituted C3 to C30 heteroaryl;

n is an integer from 0 to 3, and Ar is selected from substituted or unsubstituted C6 to C30 aryl, or substituted or unsubstituted C3 to C30 heteroaryl.

16. The OLED device according to claim 14, wherein the organic thin film layer comprises a light-emitting layer and a hole transport layer, wherein the light-emitting layer comprises the organic compound as a host material, and a material of the hole transport layer comprises the organic compound.

17. A display panel, comprising the OLED device according to claim 14.

* * * * *